(12) United States Patent
Yabu

(10) Patent No.: US 10,573,489 B2
(45) Date of Patent: Feb. 25, 2020

(54) CHARGED PARTICLE BEAM DEVICE AND OPTICAL-AXIS ADJUSTING METHOD THEREOF

(71) Applicant: HITACHI HIGH-TECHNOLOGIES CORPORATION, Tokyo (JP)

(72) Inventor: Shuhei Yabu, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/780,678

(22) PCT Filed: Jan. 29, 2016

(86) PCT No.: PCT/JP2016/052558
§ 371 (c)(1),
(2) Date: Jun. 1, 2018

(87) PCT Pub. No.: WO2017/130363
PCT Pub. Date: Aug. 3, 2017

(65) Prior Publication Data
US 2018/0374673 A1  Dec. 27, 2018

(51) Int. Cl.
*H01J 37/28* (2006.01)
*H01J 37/26* (2006.01)
(Continued)

(52) U.S. Cl.
CPC ............ *H01J 37/263* (2013.01); *H01J 37/12* (2013.01); *H01J 37/141* (2013.01);
(Continued)

(58) Field of Classification Search
USPC ................................................ 250/396, 311
See application file for complete search history.

(56) References Cited

U.S. PATENT DOCUMENTS

| | | | | |
|---|---|---|---|---|
| 4,588,891 A | * | 5/1986 | Saito | ........................ H01J 37/28 250/310 |
| 5,359,197 A | * | 10/1994 | Komatsu | ................ H01J 37/265 250/307 |
| 9,287,083 B2 | * | 3/2016 | Tomita | ................. H01J 37/1478 |

FOREIGN PATENT DOCUMENTS

| | | |
|---|---|---|
| JP | 06-176721 A | 6/1994 |
| JP | 2000-195453 A | 7/2000 |

(Continued)

OTHER PUBLICATIONS

Dowsett, "Electra: Electrostatic lens calculation tool with real time adjustment. A virtual optics bench for rapid determination of optical parameters using pre-characterized lenses", Nucl. Inst. and Meth. in Phys. 2011 pp. 327-331 (Year: 2011).*

(Continued)

*Primary Examiner* — Phillip A Johnston
(74) *Attorney, Agent, or Firm* — Mattingly & Malur, PC

(57) ABSTRACT

A charged particle beam device includes a charged particle source which emits a charged particle beam radiated on a sample; a condenser lens system which has at least one condenser lens focusing the charged particle beam at a predetermined demagnification; a deflector which is positioned between a condenser lens of a most downstream side and a charged particle source in the condenser lens system, and moves a virtual position of the charged particle source; and a control unit which controls the deflector and the condenser lens system. The control unit controls the deflector to move the virtual position of the charged particle source to a position of suppressing a deviation, which is caused by a change of the demagnification of the condenser lens system, of a center trajectory of the charged particle beam in the downstream of the condenser lens system.

14 Claims, 12 Drawing Sheets

(51) Int. Cl.
     *H01J 37/21*     (2006.01)
     *H01J 37/12*     (2006.01)
     *H01J 37/141*    (2006.01)
     *H01J 37/147*    (2006.01)

(52) U.S. Cl.
     CPC ...... *H01J 37/1471* (2013.01); *H01J 37/1475* (2013.01); *H01J 37/1477* (2013.01); *H01J 37/21* (2013.01); *H01J 37/28* (2013.01); *H01J 2237/1501* (2013.01)

(56) References Cited

FOREIGN PATENT DOCUMENTS

| | | |
|---|---|---|
| JP | 2005-521990 A | 7/2005 |
| JP | 2010-218912 A | 9/2010 |

OTHER PUBLICATIONS

International Search Report of PCT/JP2016/052558 dated May 10, 2016.

Japanese Office Action received in corresponding Japanese Application No. 2017-563482 dated May 7, 2019.

\* cited by examiner (a)

(b)

(a)

(b)

(a)

(b)

(a)

(b)

(c)

(d)

CHARGED PARTICLE BEAM DEVICE AND OPTICAL-AXIS ADJUSTING METHOD THEREOF

TECHNICAL FIELD

The present invention relates to a charged particle beam device, and particularly to a charged particle beam device in which an optical-axis deviation is properly suppressed to stably acquire a high brightness image.

BACKGROUND ART

As a background art in this technical field, there are disclosed in JP-A-2000-195453 (PTL 1) and JP-T-2005-521990 (PTL 2). In a charged particle beam device represented by a scanning electron microscope or a transmission electron microscope, the charged particle beam focused thinly by an electrostatic lens, an electromagnetic lens, or the like is scanned on the sample, and desired information (for example, the sample image) is obtained from the sample.

In such a charged particle beam device, in a case where the trajectory of the charged particle beam is deviated from the central axis of the objective lens (in a case where the optical-axis deviation occurs), the transverse chromatic aberration of the lens is increased. The increase of the aberration causes the resolving power or the resolution of the sample image to decrease remarkably. In addition, the optical-axis deviation causes the reduction of the brightness of the sample image, or the deviation of a field of view during the focus adjustment.

In a case where the thermionic-emission electron gun represented by the tungsten filament is used as a charged particle source, the filament is cut in several tens to several hundreds of hours. In a case where the filament is cut, the replacing work of the filament is necessary. The position of the charged particle source is changed before and after the replacement of the filament, and thus the axial adjustment for correcting the position change is required. The position of the charged particle source affects particularly on the brightness when the sample image is acquired.

The axial adjustment according to the replacing work and the replacement is required similarly, for example, even in a case where a field emission type electron gun is used other than the tungsten filament.

Accordingly, in order to acquire the sample image without the deviation of the field of view with high resolution and high brightness, the optical axis of the charged particle beam device is necessarily adjusted with high accuracy.

As a conventional axial adjustment method, a method is known which manually adjusts operating conditions of a deflector (aligner) for axial adjustment such that the movement of the sample image and the like caused by the change of the excitation current when the excitation current of the objective lens and the like are changed periodically.

In JP-A-2000-195453 (PTL 1), a technique is disclosed which automatically adjusts the optical axis of the charged particle beam by changing the excitation setting value of the aligner on the basis of the transition of the electron beam irradiation position which is changed between two excitation conditions of the objective lens.

In JP-T-2005-521990 (PTL 2), a technique is disclosed which electromagnetically and automatically adjusts the virtual position of the charged particle source or the like such that a gun alignment coil provided in the lower level of the charged particle source improves the brightness of the sample image.

CITATION LIST

Patent Literature

PTL 1: JP-A-2000-195453
PTL 2: JP-T-2005-521990

SUMMARY OF INVENTION

Technical Problem

The present inventor has made a keen examination on the optical-axis deviation of the charged particle beam device occurring when the dose of a primary charged particle beam is changed by the electromagnetic lens or the electrostatic lens arranged on the optical path, and have come to gain the following knowledge.

In the charged particle beam device, optical conditions of a condenser lens provided on the optical path are changed to adjust the dose of the charged particle beam irradiating the sample, for example. Particularly, in the scanning electron microscope using the thermionic-emission electron gun, in a case where the high resolution is obtained, and in a case where the high brightness is necessary for an elementary analysis and the like, the demagnification in the condenser lens is largely changed to, for example, $1/300$ to $1/3$. When the optical conditions are changed, the trajectory of the electron beam is changed so that the optical-axis deviation occurs.

The methods of PTLs 1 and 2 can automatically adjust the optical axis of the charged particle beam, the virtual position of the charged particle source, or the like, but is not associated with the change of the optical conditions. That is, whenever the optical conditions are changed, the operator necessarily adjusts the optical axis or the virtual position of the charged particle source. In addition, in the methods of PTLs 1 and 2, there is a possibility that the sample image in which the brightness, the resolution or the like is deteriorated is observed while it is not known that the optical axis is deviated by the change of the optical conditions. Further, as described above, the optical-axis deviation causes the deviation of the field of view. For this reason, there is a possibility that an observation target disappears out of sight by the deviation of the field of view when the operator changes the optical-axis condition.

An object of the invention is to suppress an optical-axis deviation even when optical conditions are changed.

Solution to Problem

In order to achieve the object described above, an embodiment of the invention includes: a charged particle source which emits a charged particle beam to be radiated on a sample; a condenser lens system which has at least one condenser lens focusing the charged particle beam at a predetermined demagnification; a deflector which is positioned between a condenser lens of a most downstream side and a charged particle source in the condenser lens system, and moves a virtual position of the charged particle source; and a control unit which controls the deflector and the condenser lens system. The control unit controls the deflector to move the virtual position of the charged particle source to a position of suppressing a deviation, which is caused by a change of the demagnification of the condenser lens system, of a center trajectory of the charged particle beam in the downstream of the condenser lens system.

Advantageous Effects of Invention

According to the invention, the optical-axis deviation of the charged particle beam can be suppressed even when the optical conditions of the charged particle beam are changed.

DESCRIPTION OF EMBODIMENTS

A principle that an optical-axis deviation or the deviation of a field of view occurs according to a change of optical conditions of a charged particle beam device will be described with reference to the drawings.

Figure 1:
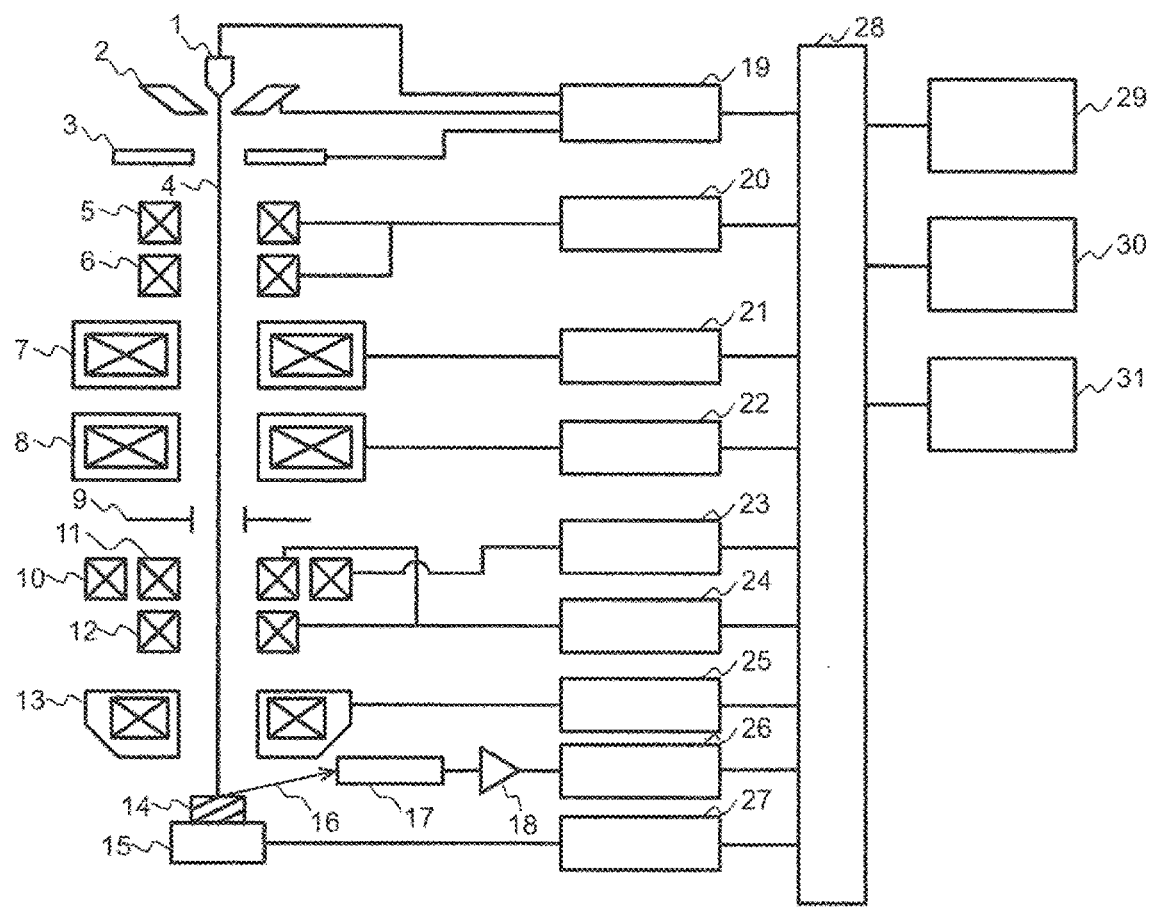
FIG. 1 is a schematic view of a scanning electron microscope.

FIG. 1 is a schematic view of a scanning electron microscope which is one of the charged particle beam device. However, the following description is not limited to the scanning electron microscope, and may be applied to a transmission electron microscope, a scanning transmission electron microscope, a focused ion beam device, and the like.

The scanning electron microscope includes a filament 1 which emits a primary electron beam 4 for irradiating a sample 14, a Wehnelt 2 which focuses the primary electron beam 4, an anode 3 which accelerates the primary electron beam 4 passing through the Wehnelt 2 in a predetermined acceleration voltage $V_{acc}$, and guides the primary electron beam 4 to a downstream electron optical system, a stage 15 which is controlled by a stage control circuit 27, and on which the sample 14 is placed, a computer 28 which controls the entire device, and the like.

Herein, the current flowing in the filament 1, the voltage and the acceleration voltage $V_{acc}$ applied to the Wehnelt 2, and the like are controlled by a high voltage control circuit 19.

As described below, an optical-axis adjusting method in the embodiments is effective especially in a case where the filament 1 is a heat emission type. However, the filament 1 is not limited to the heat emission type, and may also be adopted as a field emission type or a schottky type.

The electron optical system includes an upper gun alignment coil 5 and a lower gun alignment coil 6 in which the virtual position of the filament 1 or the degree of the inclination of the primary electron beam 4 is adjustable, a first condenser lens 7 and a second condenser lens 8 for focusing the primary electron beam 4 at a predetermined demagnification, an upper deflection coil 11 and a lower deflection coil 12 for two-dimensionally scanning the primary electron beam 4 on the sample 14, an objective lens 13 for focusing the primary electron beam 4 on the sample 14, and the like.

The electron optical system includes an aligner 10 which allows the primary electron beam 4 to pass through the center of the objective lens 13.

These elements of the electron optical system operate the electromagnetic force with respect to the primary electron beam 4 and adjust the condition of the radiation of the primary electron beam 4 to the sample, and may be used by combining freely an electrostatic induction type and an electromagnetic induction type according to the object.

These elements are connected with a gun alignment control circuit 20, a first condenser lens control circuit 21, a second condenser lens control circuit 22, an aligner control circuit 23, a deflection control circuit 24, an objective lens control circuit 25, and the like, respectively. The control circuits controls the operation of the element by adjusting the current amount or the voltage value of the element, respectively.

The electron optical system includes an objective aperture 9 which restrains the amount of radiating the primary electron beam 4 to the sample 14. The objective aperture 9 is arranged on the filament 1 side from the objective lens 13, and is desirably arranged between the second condenser lens 8 and the objective lens 13. Incidentally, another aperture may be provided in addition to the objective lens aperture 9 inside the electron optical system.

Herein, the number of levels of the gun alignment coil is two, but the number of levels of the gun alignment coil may be one or two or more. However, two or more levels are desirable because of the following reasons.

In a case where the filament 1 is attached obliquely, the primary electron beam 4 is emitted in an inclined state. In this case, in order to use the portion, which has the highest brightness, of the primary electron beam 4, it is necessary to deflect the primary electron beam 4 by using the gun alignment coil and compensate the inclination of the primary electron beam 4.

In a case where the number of levels of the gun alignment coil (deflector) is one, when the primary electron beam 4 is deflected by the gun alignment coil, the inclination of the primary electron beam 4 is compensated and the virtual position of the filament 1 is changed. The change of the virtual position of the filament 1 also affects the optical axis. On the other hand, in a case where the number of levels of the gun alignment coil is two or more, a control can be performed which changes only the inclination angle of the primary electron beam 4 without changing a virtual light source position. For this reason, in a case where the number of levels of the gun alignment coil is two or more, the brightness of the sample image can be adjusted to be maximized in a state where the optical axis is maintained.

The first condenser lens 7 or the second condenser lens 8 controls the excitation of the electromagnetic lens to change the demagnification of the primary electron beam 4. The convergence angle of the primary electron beam 4 at the time of passing through the objective aperture 9 is changed when the demagnification is changed. In a case where the convergence angle of the primary electron beam 4 is large (a case where the demagnification is high), the interception amount of the primary electron beam 4 by the objective aperture 9 becomes large, and thus the irradiation amount of the primary electron beam 4 to the sample 14 becomes large. On the other hand, in a case where the convergence angle of the primary electron beam 4 is small (a case where the demagnification is low), the interception amount of the primary electron beam 4 becomes small, and thus the irradiation amount to the sample 14 becomes large. That is, the irradiation amount of the primary electron beam 4 to the sample 14 can be adjusted by changing the demagnification of the primary electron beam 4 by the condenser lens.

Incidentally, in this specification, "the demagnification of the primary electron beam 4 by the condenser lens" may be referred to as "the demagnification of the primary electron beam 4" or "the demagnification of the condenser lens".

Herein, the number of levels of the condenser lens is two, but the number of levels of the condenser lens may be one or two or more. The condenser lens having a plurality of levels is provided so as to obtain a larger demagnification. The large controlling range of the demagnification of the condenser lens is also desirable to treat a wide observation condition.

Incidentally, the demagnification may be presented as a decimal or a fraction (for example, 0.2 times or ⅕). In a case where the primary electron beam 4 is not demagnified at all, the demagnification is 1. In this specification, "a case where the demagnification is high" may indicates "a case where (primary electron beam 4) is demagnified more strongly". When a case where the demagnification is 0.2 times (⅕) is compared to a case where the demagnification is 1, the case of 0.2 times is small in terms of a numerical value, but the case of 0.2 times is large in terms of the demagnification.

The objective lens 13 is an out lens type, but may be a semi-in-lens (snorkel lens) type or an in lens type.

The primary electron beam 4 passing through the electron optical system is radiated on the sample 14. A signal 16 such as secondary electrons and reflection electrons emitted from the primary electron beam irradiation point of the sample 14, and X ray is detected by the detector 17, and is amplified by an amplifier 18 connected to a signal control circuit 26, so as to acquire an electron microscopy image or the like of the surface of the sample.

The computer 28 is connected with various control circuits, and controls the entire device.

The information of the signal 16 such as the secondary electrons amplified by the amplifier 18 is displayed on the display device 29 connected to the computer 28.

The computer 28 is connected to a storage unit 30 for storing the observation image or a calculation result, and an input unit 31 for inputting the observation condition or the like as well as the display device 29. In addition, an image acquisition unit for acquiring the observation image displayed on the display device 29 as the image information, an image processing unit for performing various kinds of image processing on the observation image, a calculation unit which calculates the sensitivity parameter or the like of the electron optical system, or the like may be connected.

The control circuit may be configured to be a control circuit having a plurality of control functions, or configured to use a plurality of computers or display devices.

Figure 2:
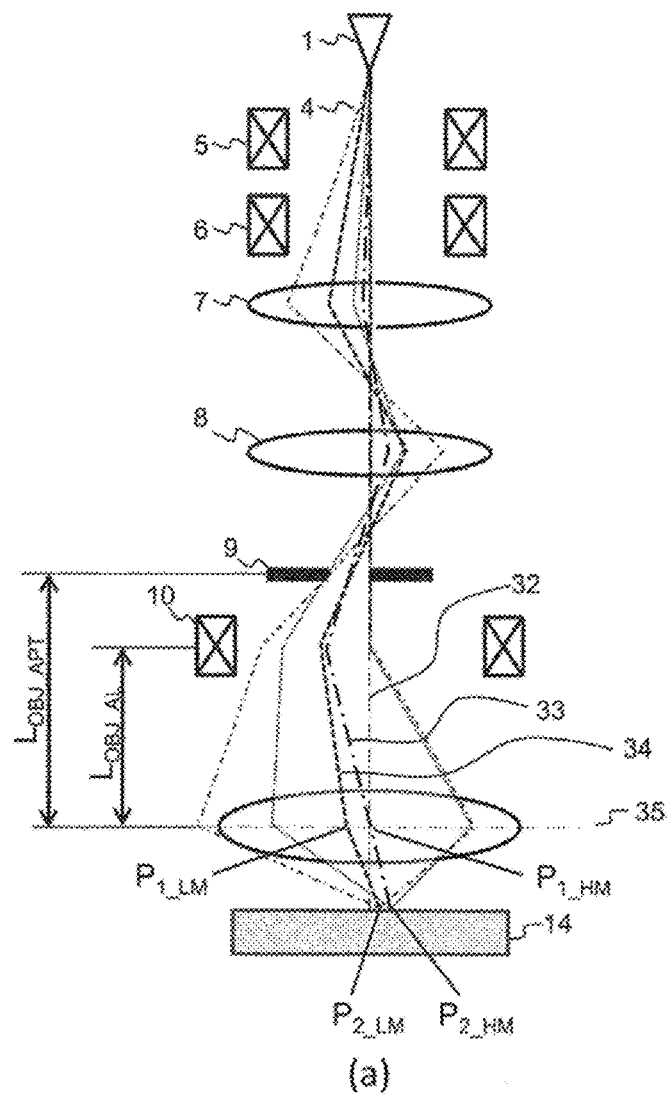
FIG. 2 is a view of explaining a principle that an optical-axis deviation or the deviation of a field of view occurs when a demagnification is changed.
Figure 2:
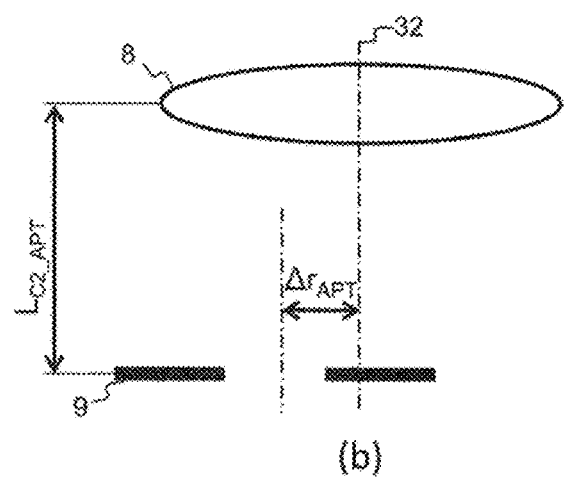

FIG. 2 is a view of explaining a principle that an optical-axis deviation or the deviation of a field of view occurs when the demagnifications of the first condenser lens 7 and the second condenser lens 8 are changed. FIG. 2(*a*) is an overall view illustrating from the filament 1 to the sample 14, and FIG. 2(*b*) is an enlarged view illustrating the vicinity of the second condenser lens 8 and the objective aperture 9.

In FIG. 2, it is assumed that the filament 1, the first condenser lens 7, the second condenser lens 8 are arranged such that each central axis thereof matches the central axis (optical axis 32) of the objective lens 13, the objective aperture 9 is provided in the position separated by $L_{C2\_APT}$ in the lower stage of the second condenser lens 8, and the central axis is deviated by $\Delta r_{APT}$ from the optical axis 32. In addition, the objective lens 13 is provided in the position separated by $L_{OBJ\_APT}$ in the lower stage of the objective aperture 9.

Incidentally, in this specification, the central axis of the objective lens 13 is described as the optical axis 32. However, the axis of another component may be set as a reference and may be considered as the optical axis 32.

In the example of FIG. 2, a case is considered in which the central axis of the objective aperture 9 is deviated from the optical axis. However, similarly, a case also may be considered in which the filament 1, the central axis of the first condenser lens 7 and/or the second condenser lens 8 are deviated from the optical axis.

The aligner 10 is provided to be separated by a distance of $L_{OBJ\_AL}$ above the objective lens 13. The aligner 10 adjusts the primary electron beam 4 such that the beam center trajectory passes through the center of the objective lens 13.

When the demagnification of the first condenser lens 7 and/or the second condenser lens 8 is changed, in a case where the center of the objective aperture 9 is deviated from the optical axis, the beam center trajectory is changed since the angle of the primary electron beam 4 which can pass through the objective aperture 9 is different depending on the magnitude of the demagnification. Hereinafter, the beam center trajectory in a case where the demagnification of the condenser lens is high will be described as the first center trajectory 33, and the beam center trajectory in a case where the demagnification of the condenser lens is low will be described as the second center trajectory 34.

A case is considered in which the demagnification is decreased from an ideal state where the first center trajectory 33 passes through the optical axis 32 on the main surface 35 of the objective lens 13. When the demagnification is decreased, the position of the beam center trajectory on the main surface 35 of the objective lens 13 moves from $P_{1\_HM}$ to $P_{1\_LM}$. That is, the second center trajectory 34 passes through the outside of the optical axis 32. As described above, when the beam center trajectory passes through the outside of the optical axis 32 on the main surface 35 of the objective lens 13, the transverse chromatic aberration becomes large, and the sample image of the high resolution cannot be obtained.

In a case where the demagnification is decreased in a state where the central axis of the objective aperture 9 is deviated from the optical axis 32, the irradiation position of the primary electron beam 4 on the sample 14 moves from $P_{2\_HM}$ to $P_{2\_LM}$. For this reason, the deviation of the field of view occurs when the demagnification is changed.

In a case where the beam center trajectory passes through the outside of the optical axis 32 on the main surface 35, the observation position is changed by the change of the focus of the objective lens 13 without changing the demagnification. As a result, the adjustment of the focus of the charged particle beam device becomes difficult.

As described above, in a case where the optical-axis deviation (the deviation of the central axis of the objective aperture 9 or the deviation of the first center trajectory 33 and the second center trajectory 34) is large, a negative effect caused by the change of the optical conditions is large. For this reason, whenever the optical conditions are changed, it is necessary to adjust the beam center trajectory to pass through the optical axis 32 on the main surface 35 by using the aligner 10.

Figure 3:
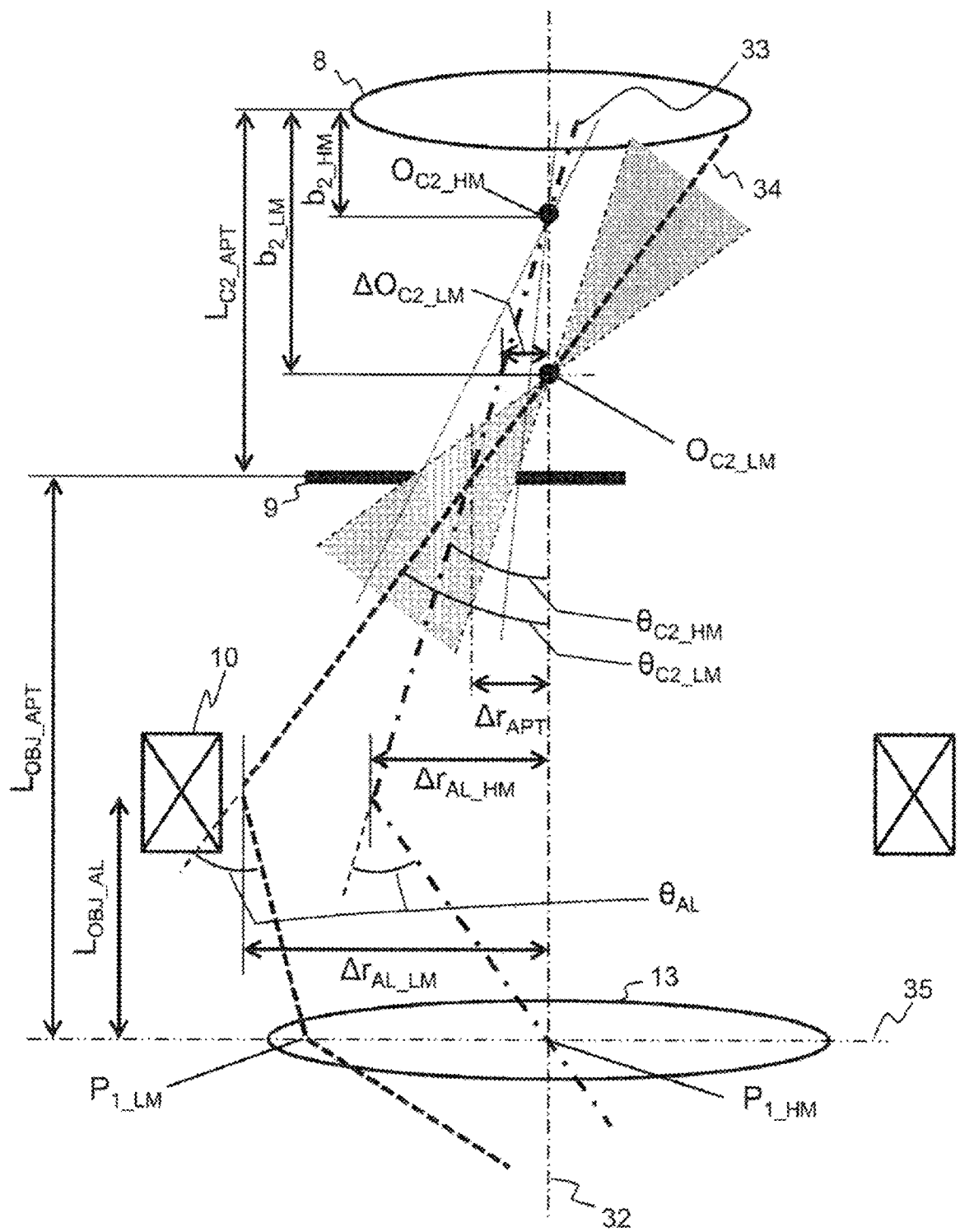
FIG. 3 is an enlarged view illustrating a portion between a second condenser lens and an objective lens in Embodiment 1.

FIG. 3 is an enlarged view illustrating a portion between the second condenser lens 8 and the objective lens 13 in FIG. 2. However, the upper deflection coil 11 and the lower deflection coil 12 are not illustrated.

In the first condenser lens 7 or the second condenser lens 8, the position of the focusing point to be formed is changed by controlling the demagnification. In the example of FIG. 3, the focusing point $O_{C2\_HM}$ in a case where the demagnification is high is positioned a distance of $b_{2\_HM}$ from the second condenser lens 8, and the focusing point $O_{C2\_LM}$ in a case where the demagnification is low is positioned a distance of $b_{2\_LM}$ from the second condenser lens 8.

In a case where the centers of the filament 1, the first condenser lens 7, and the second condenser lens 8 are arranged on the optical axis 32, each of the focusing points $O_{C2\_HM}$ and $O_{C2\_HM}$ is formed on the optical axis 32.

The center trajectory of the electron beam radiated on the sample is determined by a trajectory of a straight line which connects the focusing point and the objective aperture 9. An inclination $\theta_{C2\_HM}$ of the first center trajectory 33 (in a case where the demagnification is high) at the time of passing through the objective aperture 9 is represented by a following expression.

$$\theta_{C2\_HM} = \Delta r_{\_APT}/(L_{C2\_APT} - b_{2\_HM})$$

The first center trajectory 33 is deviated $\Delta r_{AL\_HM}$ from the optical axis 32 in the position of the aligner 10, and $\Delta r_{AL\_HM}$ is represented by a following expression.

$$\Delta r_{AL\_HM} = (L_{C2\_APT} - b_{2\_HM} + L_{OBJ\_APT} - L_{OBJ\_AL}) \theta_{C2\_HM}$$

When the aligner 10 is adjusted such that the first center trajectory 33 passes through the optical axis 32 on the main surface 35, the deflection angle $\theta_{AL}$ of the beam center trajectory by the aligner 10 is given by the following expression.

$$\theta_{AL} = \Delta r_{AL\_HM}/L_{OBJ\_AL} + \theta_{C2\_HM}$$

On the other hand, an off-axis amount $\Delta r_{AL\_LM}$ of the second center trajectory 34 in the inclination $\theta_{C2\_LM}$ and the aligner 10 of the second center trajectory 34 (in a case where the demagnification is low) at the time of passing through the objective aperture 9 is represented by a following expression.

$$\theta_{C2\_LM} = \Delta r_{APT}/(L_{C2\_APT} - b_{2\_LM})$$

$$\Delta r_{AL\_LM} = (L_{C2\_APT} - b_{2\_LM} + L_{OBJ\_APT} - L_{OBJ\_AL}) \theta_{C2\_LM}$$

If the operating condition of the aligner 10 in a case where the demagnification is low is not different from that in a case where the demagnification is high, the deflection angle $\theta_{AL}$ by the aligner 10 is not changed as well. For this reason, on the main surface 35, the optical-axis deviation ($P_{1\_LM} - P_{1\_HM}$) represented by a following expression occurs between the first center trajectory 33 and the second center trajectory 34.

$$(P_{1\_LM} - P_{1\_HM}) = \Delta r_{AL\_LM} - L_{OBJ\_AL}(\theta_{AL} - \theta_{C2\_LM}) = L_{OBJ\_APT} \Delta r_{APT}(1/(L_{APT} - b_{2\_LM}) - 1/(L_{APT} b_{2\_HM}))$$

The demagnification of the primary electron beam 4 by the condenser lens also affects the resolution of the sample image. Particularly, in the case of the heat emission type electron gun, the substantial diameter of the electron source becomes several tens of micrometers. For this reason, in order to obtain the resolution of several nanometers, the demagnification of the primary electron beam 4 is necessarily set from 1/300 to 1/500.

On the other hand, at the time of the elementary analysis and the like, in a case where it is necessary to enlarge the irradiation amount of the primary electron beam 4 radiated on the sample, the demagnification of the primary electron beam 4 by the condenser lens is decreased. It is because, as described above, the interception amount of the primary electron beam 4 by the objective aperture 9 is also decreased by decreasing the demagnification, and the irradiation amount of the primary electron beam 4 is enlarged as a result. In a general-purpose electron microscope, in a case where the electron dose is maximized, the demagnification is controlled to be 1/5.

As described above, the demagnification is changed considerably according to the purpose of the observation. When the demagnification is changed largely, the difference between the focusing points $O_{C2\_HM}$ and $O_{C2\_LM}$ is enlarged, the amount ($P_{1\_LM} - P_{1\_HM}$) of the optical-axis deviation is also enlarged.

Hereinafter, the embodiment of the invention will be described with reference to the drawings.

In the embodiment, a charged particle beam device is disclosed which includes: a charged particle source which emits a charged particle beam to be radiated on a sample; a condenser lens system which has at least one condenser lens focusing the charged particle beam at a predetermined demagnification; a deflector which is positioned between a condenser lens of a most downstream side and a charged particle source in the condenser lens system, and moves a virtual position of the charged particle source; and a control unit which controls the deflector and the condenser lens system. The control unit controls the deflector to move the virtual position of the charged particle source to a position of suppressing a deviation, which is caused by a change of the demagnification of the condenser lens system, of a center trajectory of the charged particle beam in the downstream of the condenser lens system.

In the embodiment, the charged particle beam device is disclosed in which the control unit controls the deflector such that a first center trajectory of the charged particle beam in the downstream of the condenser lens system in a case where the condenser lens system has a first demagnification is matched with a second center trajectory of the charged particle beam in the downstream of the condenser lens system in a case where the condenser lens system has a second demagnification lower than the first demagnification.

In the embodiment, the charged particle beam device is disclosed in which the condenser lens system has two or more condenser lenses, and in a case where the condenser lens system has a third demagnification in addition to the first demagnification and the second demagnification, the control unit moves a focusing point of the charged particle beam between the condenser lens system and the sample, such that a third center trajectory of the charged particle beam in the downstream of the condenser lens system in a case where the condenser lens system has the third demagnification is matched with the first center trajectory or the second center trajectory.

In the embodiment, the charged particle beam device is disclosed which further includes: an objective lens which focuses the charged particle beam to the sample; and an adjusting unit which is connected to the control unit and adjusts a condition of a radiation of the charged particle beam to the sample. In a case where the condenser lens system has the first demagnification, the control unit controls the adjusting unit such that the first center trajectory passes through a central axis of the objective lens in a main surface of the objective lens, and the first center trajectory and the second center trajectory match each other.

In the embodiment, the charged particle beam device is disclosed which includes: the objective lens which focuses the charged particle beam to the sample; an aperture which is arranged on a path of the charged particle beam; a detector which detects a signal obtained by scanning the charged particle beam on the aperture; a signal processing unit which forms an image, which indicates a positional relation between a central axis of the objective lens and a center trajectory of the charged particle beam in the downstream of the condenser lens system, on the basis of the signal of the detector; a display which displays an image formed by the signal processing unit; and a condition operating unit which operates a control condition of the adjusting unit and the deflector by the control part.

In the embodiment, the charged particle beam device is disclosed in which the aperture is a fixed type.

In the embodiment, the charged particle beam device is disclosed in which a control condition of the adjusting unit and the deflector is operatable by the condition operating part independently in a case where the condenser lens system has the first demagnification and in a case where the condenser lens system has the second demagnification.

In the embodiment, the charged particle beam device is disclosed which includes: a charged particle source which emits a charged particle beam radiated on the sample; a condenser lens system which has at least one condenser lens focusing the charged particle beam at a predetermined demagnification; a deflector which is positioned between a condenser lens of a most downstream side and a charged particle source in the condenser lens system, and moves a virtual position of the charged particle source; an adjusting unit which adjusts a condition of a radiation of the charged particle beam to the sample; an objective lens which focuses the charged particle beam to the sample; a detector which detects a signal obtained by colliding the charged particle beam with an object; a signal processing unit which collects information of a positional relation between a central axis of the objective lens and a center trajectory of the charged particle beam in a downstream of the condenser lens system from the signal of the detector; a display; and a condition operating unit which operates an operating condition of the adjusting unit and the deflector. The signal processing unit displays information, which is collected by the signal processing unit, of the positional relation between the central axis of the objective lens and the center trajectory of the charged particle beam on the display, and the signal processing unit displays a user interface on the display, which prompts the condition operating unit to perform an operation such that a first center trajectory of the charged particle beam in the downstream of the condenser lens system in a case where the condenser lens system has a first demagnification is matched with a second center trajectory of the charged particle beam in the downstream of the condenser lens system in a case where the condenser lens system has a second demagnification lower than the first demagnification.

In the embodiment, the charged particle beam device is disclosed in which the signal processing unit operates an operating condition of the adjusting unit such that the first center trajectory passes through the central axis of the objective lens in a main surface of the objective lens in a case where the condenser lens system has the first demagnification, and then operates an operating condition of the deflector such that the first center trajectory is matched with the second center trajectory.

In the embodiment, the charged particle beam device is disclosed which further includes: an aperture which is arranged on a path of the charged particle beam. The detector detects a signal obtained by scanning the charged particle beam on the aperture, the signal processing unit forms an image, which indicates the positional relation between the central axis of the objective lens and the center trajectory of the charged particle beam, on the basis of the signal of the detector, and the signal processing unit displays the image, which is formed by the signal processing unit, on the display.

In the embodiment, an adjusting method of a charged particle beam device is disclosed which includes: a process of changing a first center trajectory of the charged particle beam before and after the lens effect by adjusting a deflection angle of the charged particle beam by the electron optical system in a case where the charged particle beam is demagnified at the first demagnification; and a process of matching a second center trajectory of the charged particle beam before and after the lens effect with the first center trajectory by adjusting a virtual position of the charged particle source by the electron optical system in a case where the charged particle beam is demagnified at a second demagnification lower than the first demagnification.

In the embodiment, the adjusting method of the charged particle beam device is disclosed in which in the process of changing the first center trajectory, the deflection angle of the charged particle beam is adjusted such that the first center trajectory passes through a center of an electromagnetic field making the lens effect.

In the embodiment, the adjusting method of the charged particle beam device is disclosed in which a signal processing unit collects information of a positional relation between the center of the electromagnetic field making the lens effect and the first center trajectory of the charged particle beam after the lens effect from a signal obtained by colliding the charged particle beam with an object, and in the process of changing the first center trajectory, the signal processing unit calculates an adjusting amount of the deflection angle of the charged particle source from the information of the positional relation.

In the embodiment, the adjusting method of the charged particle beam device is disclosed in which a signal processing unit collects information of a positional relation between the center of an electromagnetic field making the lens effect and the first center trajectory of the charged particle beam after the lens effect from a signal obtained by colliding the charged particle beam with an object, and in the process of matching the second center trajectory with the first center trajectory, the signal processing unit calculates an adjusting amount of the virtual position of the charged particle source from the information of the positional relation.

In the embodiment, the adjusting method of the charged particle beam device is disclosed in which a signal processing unit collects the information of a positional relation between a center of an electromagnetic field making the lens effect and a center trajectory of the charged particle beam after the lens effect from a signal obtained by colliding the charged particle beam with an object, in the process of changing the first center trajectory of the charged particle beam, the signal processing unit displays a user interface on a screen for displaying the positional relation between the center of the electromagnetic field and the first center trajectory, and in the process of matching the second center trajectory with the first center trajectory, the signal processing unit displays the user interface on the screen for displaying the positional relation between the center of the electromagnetic field and the second center trajectory.

Embodiment 1

The basic configuration of the charged particle beam device in this embodiment can be adopted to be similar to the device illustrated in FIG. 1.

The optical-axis deviation which has been described above is caused when the focusing points $O_{C2\_HM}$ and $O_{C2\_LM}$ formed below the second condenser lens 8 are not on the same trajectory. In other words, the optical-axis deviation caused by the change of the demagnification can be suppressed when the focusing points $O_{C2\_HM}$ and $O_{C2\_LM}$ are positioned on the same trajectory.

In this regard, in this embodiment, the position (virtual position 36) of the virtual electron source is moved by the gun alignment coil, such that the focusing point in a case where the demagnification is low is arranged on the beam center trajectory in a case where the demagnification is high.

Conventionally, the gun alignment coil can be used to maximize the brightness of the sample image under each of the optical conditions by using the image (filament image) which obtained by scanning the upper gun alignment coil 5 and/or the lower gun alignment coil 6 with the primary electron beam 4.

As in this embodiment, an adjustment is not performed which matches the first center trajectory 33 with the second center trajectory 34 by using the gun alignment coil. For this reason, conventionally, the optical-axis deviation occurs when the optical conditions are changed.

Particularly, in the case of the thermionic-emission electron gun, the replacement frequency of the filament 1 is high, and the adjustment of the virtual position 36 of the filament 1 is performed at that time by the gun alignment coil or the like. For this reason, the optical conditions change at every adjustment.

In this regard, when the adjustment is performed by the method described in this embodiment during the filament replacement or the like, it is possible to suppress the optical-axis deviation occurring when the optical conditions change.

Figure 4:
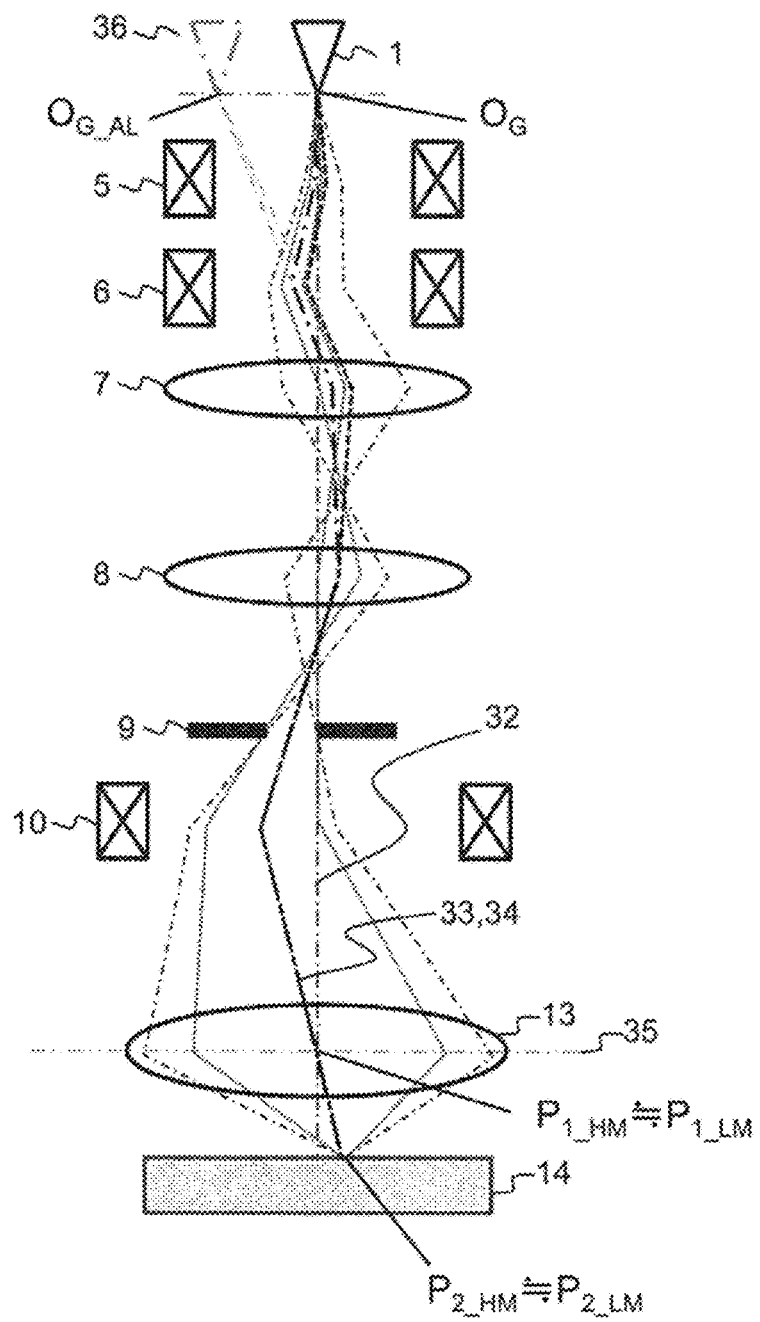
FIG. 4 is a view of a trajectory of a beam when a focusing point where a demagnification is low is arranged on a center trajectory.
Figure 5:
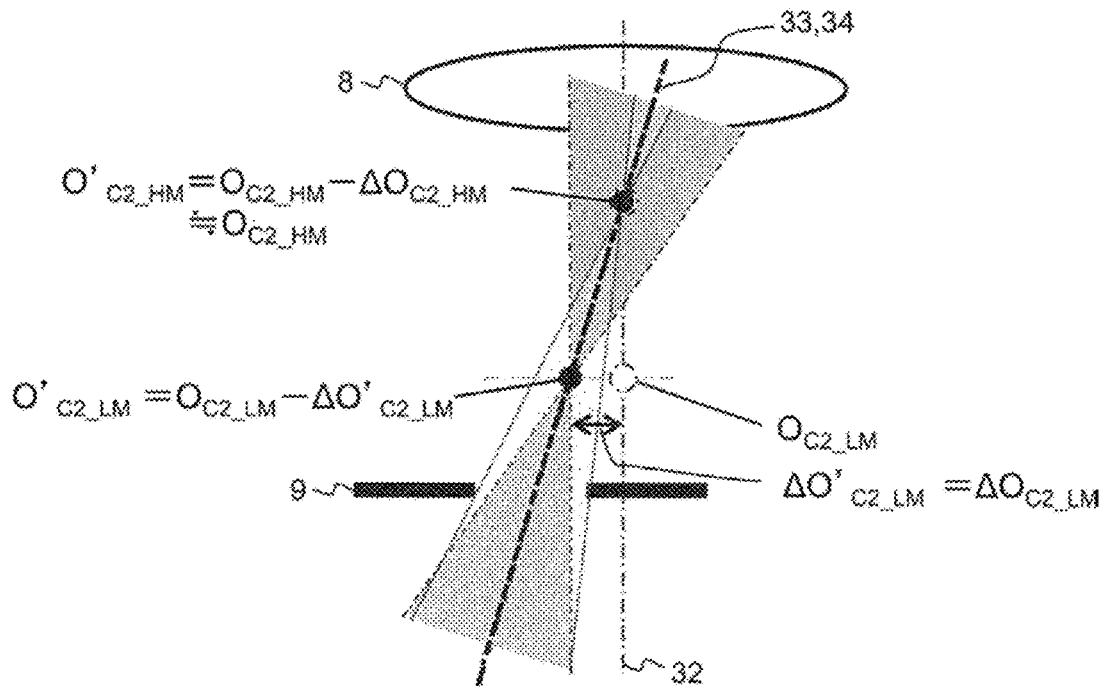
FIG. 5 is an enlarged view illustrating a portion between the second condenser lens and an objective aperture in Embodiment 1.

FIG. 4 is a view of the trajectory of the beam when the focusing point $O'_{C2\_LM}$ in a case where the demagnification is low is arranged on the first center trajectory 33 by using the gun alignment coil. FIG. 5 is an enlarged view illustrating a portion between the second condenser lens 8 and the objective aperture 9.

When the beam is deflected in the vicinity of the filament 1 by using the upper gun alignment coil 5 and the lower gun alignment coil 6, the virtual position 36 of the filament 1 moves from $O_G$ to $O_{G\_AL}$. The position of the focusing point of the second condenser lens 8 is moved in accordance therewith, but the moving amount $\Delta O_{C2}$ thereof is determined at the demagnification $M_C$ of the condenser lens. Since the moving amount of the virtual position 36 is $(O_G-O_{G\_AL})$, it is satisfied that $\Delta O_{C2}=(O_G-O_{G\_AL})\times M_C$.

The demagnification in a case where the demagnification is low is set as $M_{C\_LM}$. When the upper gun alignment coil 5 and/or the lower gun alignment coil 6 are controlled such that the moving amount $(O_G-O_{G\_AL})$ of the virtual position 36 satisfies $(O_G-O_{G\_AL})=(\Delta O_{C2\_LM}/M_{C\_LM})$, a new focusing point $O'_{C2\_LM}$ in a case where the demagnification is low can be arranged on the first center trajectory 33 (the first center trajectory 33 and the second center trajectory 34 become almost the same).

Herein, the movement of the virtual position 36 also affects the focusing point in a case where the demagnification is high, and a new focusing point in a case where the demagnification is high is set as $O'_{C2\_HM}$. For this reason, it is also considered that the first center trajectory 33 is changed before and after the operation of the gun alignment coil.

However, the demagnification $M_{C\_HM}$ in a case where the demagnification is high becomes one hundred or more times $M_{C\_LM}$. For this reason, the moving amount $\Delta O_{C2\_HM}$ of the focusing point in a case where the demagnification is high is 1/100 or less times $\Delta O_{C2\_LM}$, and thus, it is possible to ignore most effect of the movement of the virtual position 36 $(O_{C2\_HM} \cong O'_{C2\_HM})$. In other words, in a case where the demagnification is low, the focusing point moves from $O_{C2\_LM}$ to $O'_{C2\_LM}$, so that the beam trajectory is changed, but in a case where the demagnification is high, the focusing point moves little. That is, the first center trajectory 33 is maintained without being affected by the movement of the virtual position 36.

As described above, when the virtual position 36 is moved by using the gun alignment coil and $O'_{C2\_LM}$ is arranged on the first center trajectory 33, the first center trajectory 33 and the second center trajectory 34 become almost the same. As a result, even when the central axis of the objective aperture 9 is deviated from the optical axis 32, it is possible to suppress the optical-axis deviation and the deviation of the field of view caused by the change of the optical conditions.

In the conventional charged particle beam device, in a case where the central axis of the objective aperture 9 is deviated from the optical axis 32, an objective-aperture movable mechanism for returning the objective aperture 9 to an ideal position is provided. When the method described in this embodiment is used, the objective-aperture movable mechanism is not required.

Figure 6:
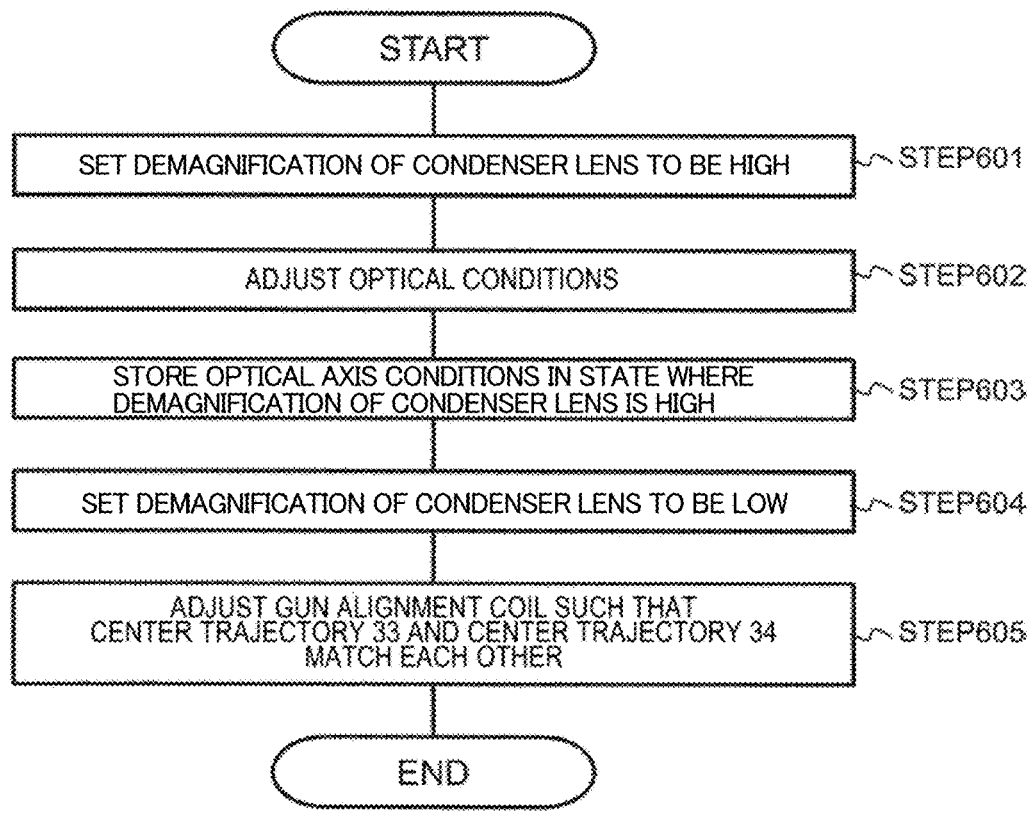
FIG. 6 is a flowchart of an adjustment sequence in Embodiment 1.

Next, the description will be given about the flow of the adjustment in this embodiment. FIG. 6 is a flowchart of an adjustment sequence in this embodiment.

STEP 601: The operator outputs an instruction to start the adjustment to the computer 28 through the input unit 31. The computer 28 outputs the instruction to the first condenser lens control circuit 21 and the second condenser lens control circuit 22 and sets the demagnification of the two condenser lenses of the first condenser lens 7 and/or the second condenser lens 8 to be high.

STEP 602: In a case where the optical conditions in a state where the demagnification is high are not optimal, the operator or the computer 28 performs the adjustment of the optical conditions by a method to be described below as necessary.

STEP 603: As necessary, the computer 28 stores, in the storage unit 30, the optical conditions (including the information of the first center trajectory 33) in a state where the demagnification of the condenser lens is high.

STEP 604: The operator or the computer 28 outputs the instruction to the first condenser lens control circuit 21 and the second condenser lens control circuit 22, and sets the demagnification of the two condenser lenses of the first condenser lens 7 and/or the second condenser lens 8 to be low.

STEP 605: The operator or the computer 28 outputs the instruction to the gun alignment control circuit 20 with reference to the optical conditions stored in the storage unit 30, and adjusts the upper gun alignment coil 5 and/or the lower gun alignment coil 6. The adjustment is performed such that the first center trajectory 33 and the second center trajectory 34 match each other.

The adjustment is completed through the above steps. As a result, the deviation of the optical axis or the field of view can be suppressed even when the state of the charged particle beam is changed, for example, when the optical conditions are changed.

In STEPs 602 and 603, anyone of (or a method of combining) methods to be described below can be used typically in order that the optical conditions are adjusted in a state where the demagnification of the condenser lens is high, the optical conditions are recorded in the storage unit 30, and the first center trajectory 33 and the second center trajectory 34 match each other though STEPs 604 and 605.

In STEP 602, a first method is a method in which the excitation of the objective lens 13 is changed (desirably changed to periodically a sine wave shape, a triangular wave shape, or a rectangular wave shape, but is not limited thereto) by using the objective lens control circuit 25, and the aligner 10 is adjusted by using the aligner control circuit 23 so as to minimize the deviation of the field of view of the sample image at that time.

When the excitation of the objective lens 13 is changed, the focusing position of the primary electron beam 4 is changed. As described above, as the primary electron beam 4 is deviated further from the optical axis 32, the deviation of the field of view caused by the change of the focusing position becomes larger. When the aligner 10 is adjusted to minimize the deviation of the field of view caused by the change of the focusing position, the first center trajectory 33 can pass through the optical axis 32 in the main surface 35.

Thereafter, in a state where the demagnification of the condenser lens is low in STEP 604, the deviation of the field of view occurs due to the optical-axis deviation.

In this regard, in STEP 605, similarly to STEP 602, the excitation of the objective lens 13 is changed by using the objective lens control circuit 25, and the deviation of the field of view of the sample image is adjusted to be minimized. However, differently from the case of STEP 602, in STEP 605, the upper gun alignment coil 5 and/or the lower gun alignment coil 6 are adjusted by using the gun alignment control circuit 20.

In a case where the position of the objective aperture 9 is not changed, the condition of the beam center trajectory such as minimizing the deviation of the field of view caused by the change of the excitation of the objective lens 13 is identical. For this reason, this method can be used to match the first center trajectory 33 with the second center trajectory 34.

In STEP 603, a second method is a method in which the position of the field of view displayed on the sample image is stored in the storage unit 30, and a position of a reference point or a reference figure of the sample image is drawn on the display device 29.

Thereafter, in STEP 604, in a state where the demagnification of the condenser lens is low, the deviation of the field of view occurs due to the optical-axis deviation.

In STEP 605, in a state where the demagnification of the condenser lens is low, the upper gun alignment coil 5 and/or the lower gun alignment coil 6 is adjusted by using the gun alignment control circuit 20, and in STEP 603, the stored field of view is allowed to match the present field of view.

A third method is a method which uses a circular shape obtained by scanning the aperture (not illustrated) or the like for controlling the degree of vacuum in the electron optical system provided in the objective lens 13 or the objective lens 13 with the primary electron beam 4. Herein, the scanning of the primary electron beam 4 is performed by changing the ratio of the deflection currents of the upper deflection coil 11 and the lower deflection coil 12.

Figure 7:
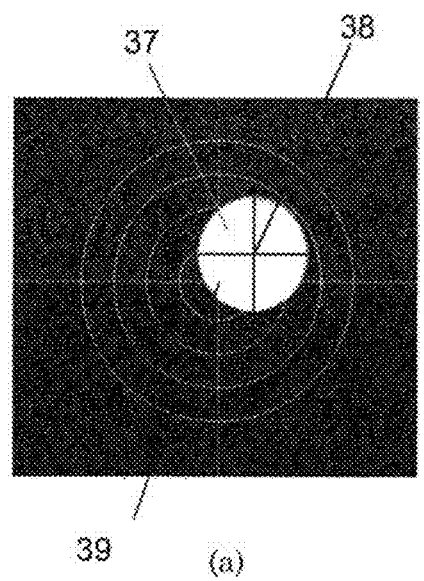
FIG. 7 is a schematic view of a circular shape.
Figure 7:
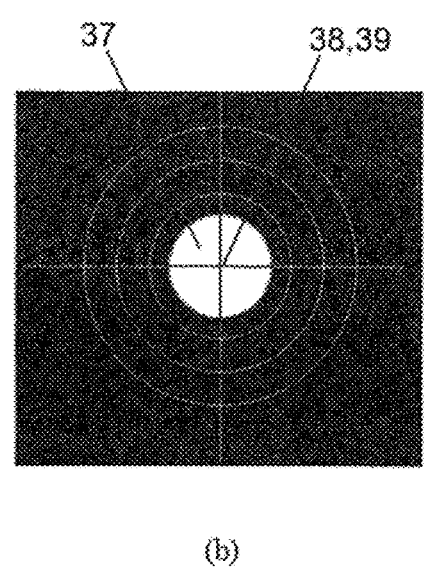

FIG. 7 is a schematic view of the circular shape obtained by the method.

In FIG. 7, the center 38 of the circular shape 37 indicates the center (optical axis 32) of the objective lens. The center 39 of the entire image indicates the center (the first center trajectory 33 or the second center trajectory 34) of the primary electron beam 4. The positional relation between the optical axis 32 and the center of the primary electron beam 4 can be visualized by the circular shape 37.

Incidentally, in FIG. 7, a cross shape is drawn in a black line inside the circular shape 37 in order to indicate the center 38 of the circular shape 37. The cross shape is drawn conveniently, and is not a display required necessarily.

As described in FIG. 7(a), in a case where the center 38 of the circular shape 37 and the center 39 of the entire image are deviated, in STEP 602, the aligner 10 is adjusted by using the aligner control circuit 23, such that the center 38 of the circular shape 37 and the center 39 of the entire image match each other (the state of FIG. 7(b)). As a result, the primary electron beam 4 passes through the optical axis 32 on the main surface 35.

Thereafter, in STEP 605, by using the circular shape 37, the upper gun alignment coil 5 and the lower gun alignment coil 6 are adjusted by using the gun alignment control circuit 20 such that the center 38 of the circular shape 37 matches the center 39 of the entire image.

In the above-described method, in STEP 602 in which the demagnification of the condenser lens is high, in the aligner 10, the adjustment is performed which matches the center 38 of the circular shape 37 with the center 39 of the entire image. In addition to the adjusting method, in STEP 603, the position of the center 38 of the circular shape 37 is stored in the storage unit 30, and may be matched with the position (the position in a case where the demagnification is high) stored in the position (the position in a case where the demagnification is low) of the center 38 of the circular shape 37 in STEP 605.

Figure 8:
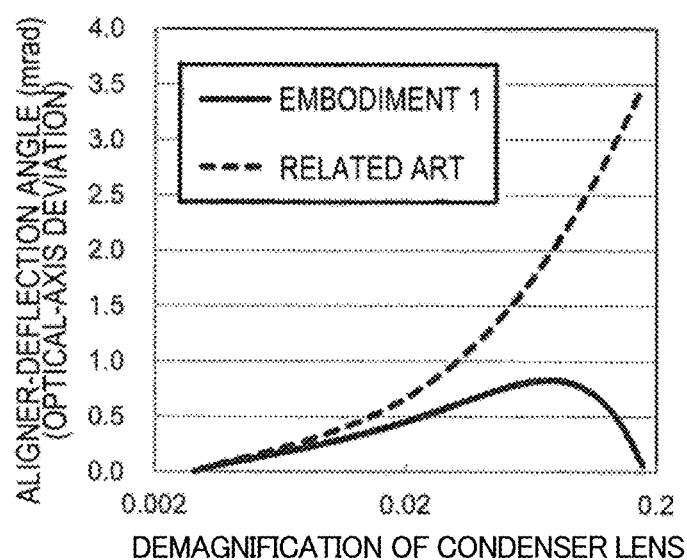
FIG. 8 is a diagram illustrating a simulation result of a length of an optical-axis deviation occurring when the demagnification is changed.

FIG. 8 is a simulation result of the optical-axis deviation occurring when the demagnification of the condenser lens is changed. Two simulations are performed with respect to the case of performing the adjustment described in this embodiment and the conventional case.

In the simulation, it is assumed that the objective aperture 9 is deviated one hundred micrometers from the central axis of the objective lens 13 ($\Delta r_{APT}$=100 micrometers). In addition, it is assumed that the device is used in which the demagnification of the condenser lens can be continuously controlled from 0.0029 to 0.18 times. The optical-axis deviation (vertical axis) is expressed by the changing amount of the deflection angle for allowing the beam center trajectory to pass through the center of the objective lens 13 by the aligner 10.

It is assumed that the adjustment illustrated in this embodiment is performed such that the center trajectories of the beam below the second condenser lens 8 are matched in a case where the demagnification of the condenser lens is maximum (0.0029 times) and a case where the demagnification is minimum (0.18 times).

In the conventional case (a dotted line in FIG. 8), the optical-axis deviation amount is also enlarged when the demagnification is low. In a case where the adjustment is performed according to this embodiment (a solid line in FIG. 8), the first center trajectory 33 and the second center trajectory 34 are almost matched in a case where the demagnification is maximum and a case where the demagnification is minimum. Thus, the optical-axis deviation amounts in the two points are almost 0. Also in the case of another demagnification, the optical-axis deviation is suppressed.

In the case of performing the adjustment illustrated in this embodiment, the maximum value of the optical-axis deviation amount is approximately 0.84 milliradians (about the demagnification of 0.1 to 0.12 times). On the other hand, the maximum value of the optical-axis deviation amount in the conventional case is approximately 3.5 milliradians (the demagnification of 0.18 times). That is, the maximum value of the optical-axis deviation is suppressed to be 76% by the adjustment illustrated in this embodiment. The optical-axis deviation occurring in a case where the demagnification of the condenser lens is changed can be suppressed by the adjustment illustrated in this embodiment, and thus it becomes unnecessary that the aligner 10 is readjusted according to the change of the demagnification.

In the above-described example, it is assumed that the gun alignment coil is adjusted such that the beam center trajectories are matched as each other with a case where the demagnification of the condenser lens is maximum and a case where the demagnification is minimum as the reference. However, the demagnification as the reference may not be a maximum value and a minimum value.

Figure 9:
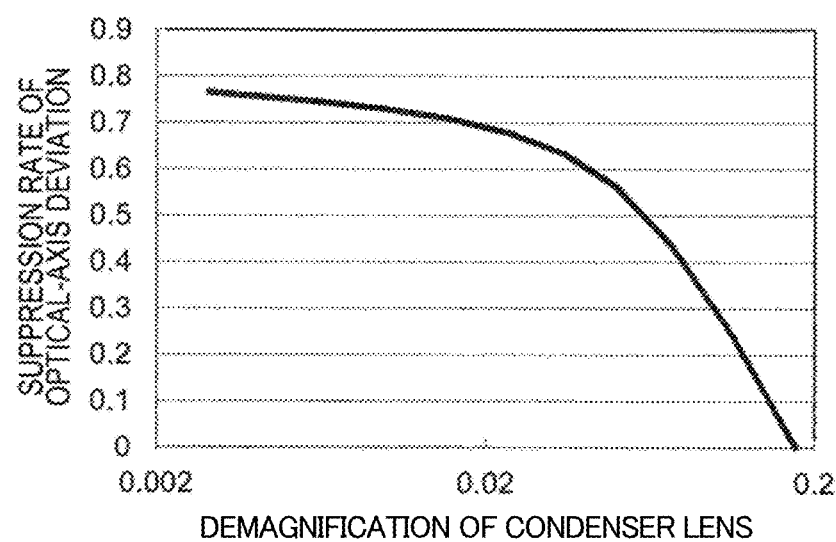
FIG. 9 is a diagram illustrating a simulation result of a suppression rate of the optical-axis deviation when a beam the center trajectory is the same between a maximum demagnification and an arbitrary demagnification.

FIG. 9 is a simulation result of the suppression rate of the optical-axis deviation when the beam center trajectory is matched between the maximum demagnification and an arbitrary demagnification. The suppression rate of the optical-axis deviation is obtained by (1−(the maximum value of the optical-axis deviation amount)/(the maximum value of the optical-axis deviation amount in the conventional case)).

As illustrated in FIG. 9, the optical-axis deviation can be suppressed even when the beam center trajectory is matched between the maximum demagnification and the arbitrary demagnification. For example, in a case where the beam center trajectory is matched in a case where the demagnification is maximum (0.0029 times) and a case where the demagnification is about 0.02 times, the optical-axis deviation can be suppressed to be about 70%.

In the above-described example, the beam center trajectory is matched between the maximum demagnification and the arbitrary demagnification. However, the beam center trajectory may be matched between the arbitrary demagnification and the minimum demagnification, and the beam center trajectory may be matched between the arbitrary demagnification and the arbitrary demagnification.

In a case where the demagnification is high, the dose of the electron radiated on the sample is lessened, and thus a signal/noise ratio of the sample image is decreased. As a result, the sample image or the like is hardly adjusted while being observed. In this regard, the beam center trajectory is matched with the demagnification of 0.02 times other than a maximum demagnification as the reference. Thus, the adjustment according to this embodiment can be performed while the signal/noise ratio is increased.

Embodiment 2

In the charged particle beam device having the same configuration as that of Embodiment 1, an optical-axis adjusting method that can further suppresses the optical-axis deviation is described in Embodiment 2. Hereinafter, the description will be given mainly about a difference from Embodiment 1.

In Embodiment 1, the adjustment is performed such that the beam center trajectory is the same in two predetermined demagnifications (for example, the maximum demagnification and the minimum demagnification). However, as illustrated in FIG. 8, in a case where a condenser lens demagnification $M_C$ is set as another rate other than the two demagnifications, the optical-axis deviation remains.

The position of the focusing point of the second condenser lens 8 is controlled as below according to the demagnification $M_C$ of the condenser lens, and thus the remaining optical-axis deviation can be suppressed further.

Figure 10:
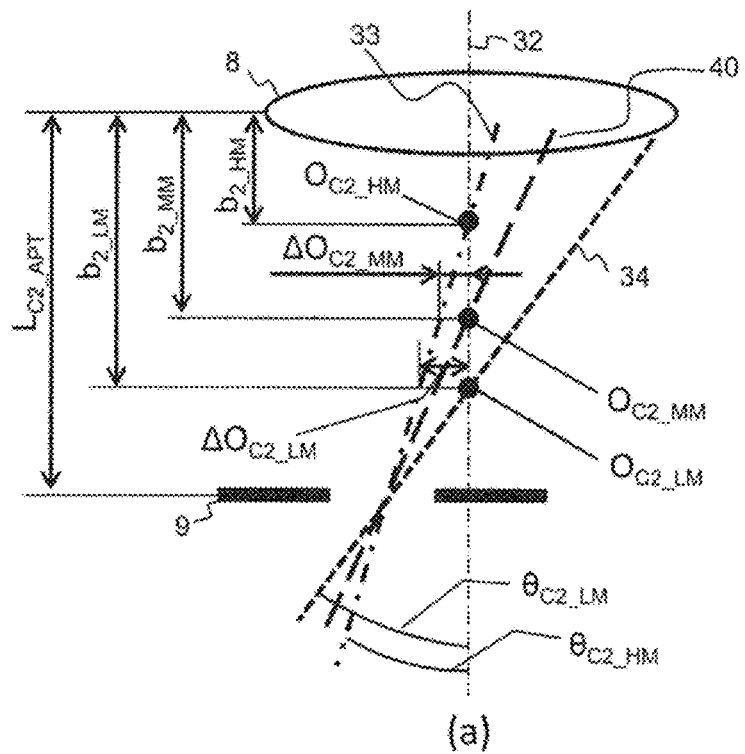
FIG. 10 is an enlarged view illustrating a portion between a second condenser lens 8 and an objective aperture 9 in Embodiment 2.
Figure 10:
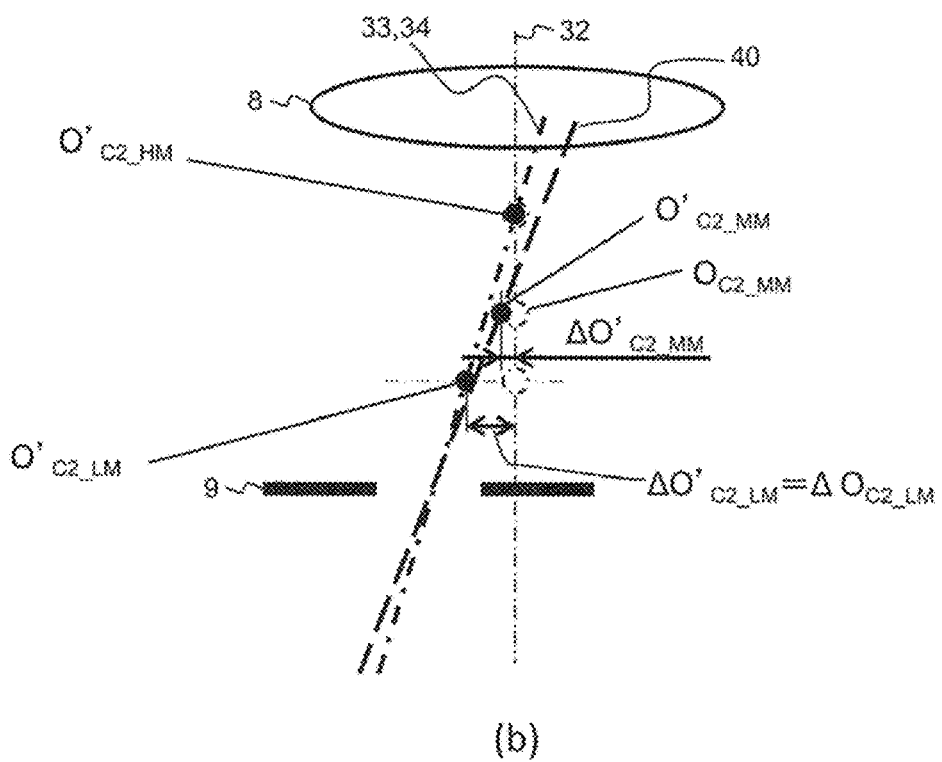

FIG. 10(a) is an enlarged view illustrating a portion between the second condenser lens 8 and the objective aperture 9 in a case where the focusing point $O_{C2\_MM}$ of the second condenser lens 8 is in an arbitrary position $b_{2\_MM}$ of $b_{2\_HM} \leq b_{2\_MM} \leq b_{2\_LM}$. The beam center trajectory passing through $b_{2\_MM}$ is set as a third center trajectory 40.

A distance $\Delta O_{C2\_MM}$ (in a vertical direction with respect to a central axis of the lens) of the first center trajectory (in a case where the demagnification is high) from the focusing point $O_{C2\_MM}$ is represented by a following expression.

$$\Delta O_{C2\_MM} = \theta_{C2\_HM} * (b_2 - b_{2\_HM})$$

$$\theta_{C2\_HM} = \Delta O_{C2\_LM} / (b_{2\_LM} - b_{2\_HM})$$

As described in FIG. 10(b), when the gun alignment coil is adjusted such that the first center trajectory 33 matches the second center trajectory 34 (in a case where the demagnification is low), the virtual moving amount $O_{G\_AL}$ and $\Delta O_{C2\_LM}$ of the electron source satisfy a relation represented by following expression.

$$\Delta O_{C2\_LM} = O_{G\_AL} * M_{C\_LM}$$

On the other hand, after the adjustment of the gun alignment coil, the moving amount $\Delta O'_{C2\_MM}$ of the focusing point which is in the arbitrary $b_{2\_MM}$ is represented by a following expression when the demagnification of the condenser lens at that time is set as $M_{C\_MM}$.

$$\Delta O'_{C2\_MM} = O_{G\_AL} * M_{C\_MM}$$

In this regard, the demagnification $M_{C\_MM}$ and the focusing point $O_{C2\_MM}$ are adjusted such that the moving amounts $\Delta O'_{C2\_MM}$ and $\Delta O_{C2\_MM}$ at that time are the same. Thus, the optical-axis deviation can be suppressed with respect to the arbitrary demagnification. In other words, the first center trajectory 33, the second center trajectory 34, and the third center trajectory 40 substantially match each other.

By using the above-described four expression, the demagnification $M_{C\_MM}$ which satisfies $\Delta O'_{C2\_MM} = \Delta O_{C2\_MM}$ is represented by the following expression.

$$M_{C\_MM} = M_{C\_LM} * (b_{2\_MM} - b_{2\_HM}) / (b_{2\_LM} - b_{2\_HM})$$

The excitation of the first condenser lens 7 and the second condenser lens 8 are adjusted such that the demagnification is changed while holding the focusing point, or the contrary (the focusing point is changed while holding the demagnification) is possible. Thus, in the arbitrary $M_{C\_MM}$, the optical-axis deviation can be suppressed as described above.

Figure 11:
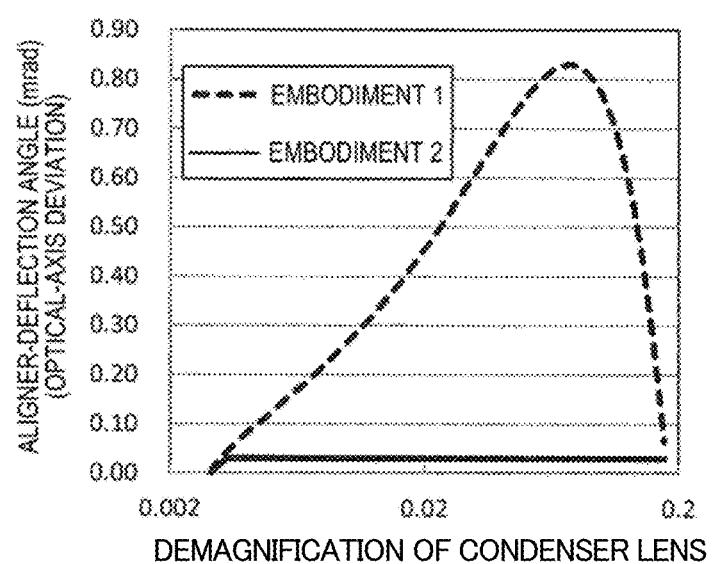
FIG. 11 is a diagram illustrating the simulation result of the optical-axis deviation occurring when the demagnification is changed in Embodiments 1 and 2.

In the method illustrated in Embodiments 1 and 2, FIG. 11 illustrates a simulation result of the optical-axis deviation occurring when the demagnification of the condenser lens is changed. The optical-axis deviation can be suppressed by the method of Embodiment 1. However, in the case of Embodiment 2, the optical-axis deviation can be suppressed further than in Embodiment 1. In the case of Embodiment 2, the optical-axis deviation amount is maintained to be almost constant even in a case where the demagnification is changed.

Comparing Embodiment 1 with Embodiment 2 in the demagnification (about 0.1 times to 0.12 times) in which the optical-axis deviation is the largest in the case of Embodiment 1, the optical-axis deviation of Embodiment 2 becomes approximately 1/20 times that of Embodiment 1.

Incidentally, in this embodiment, a case has been described in which the focusing point $O_{C2\_MM}$ of the second condenser lens 8 is in the arbitrary position $b_{2\_MM}$ of $b_{2\_HM} \leq b_{2\_MM} \leq b_{2\_LM}$. However, the relation may be $b_{2\_HM} > b_{2\_MM}$, or may be $b_{2\_MM} > b_{2\_LM}$.

Embodiment 3

In the adjusting method described in Embodiment 1 or 2, the sequence of perceiving the information of the first center trajectory 33 and adjusting the gun alignment coil when the demagnification is low is important. In this embodiment, the description will be given about a method in which the operator can perform easily the adjustment according to a desirable sequence. Hereinafter, a difference from the above embodiments will be described mainly.

In this embodiment, a case is described which performs the adjustment by the method (described by using FIG. 7) of moving the center 38 of the circular shape 37 to the center 39 of the entire image among three typical adjusting methods described in STEPs 602 to 605. However, an idea described in this embodiment can be also applied to another method.

When the filament 1 is replaced or when the operator notices the optical-axis deviation at the time of the optical condition change, the operator can instruct the computer 28 to start the adjustment through the input unit 31. When the instruction to start the adjustment is received from the operator, the computer 28 starts processes along the flow of FIG. 12.

Figure 12:
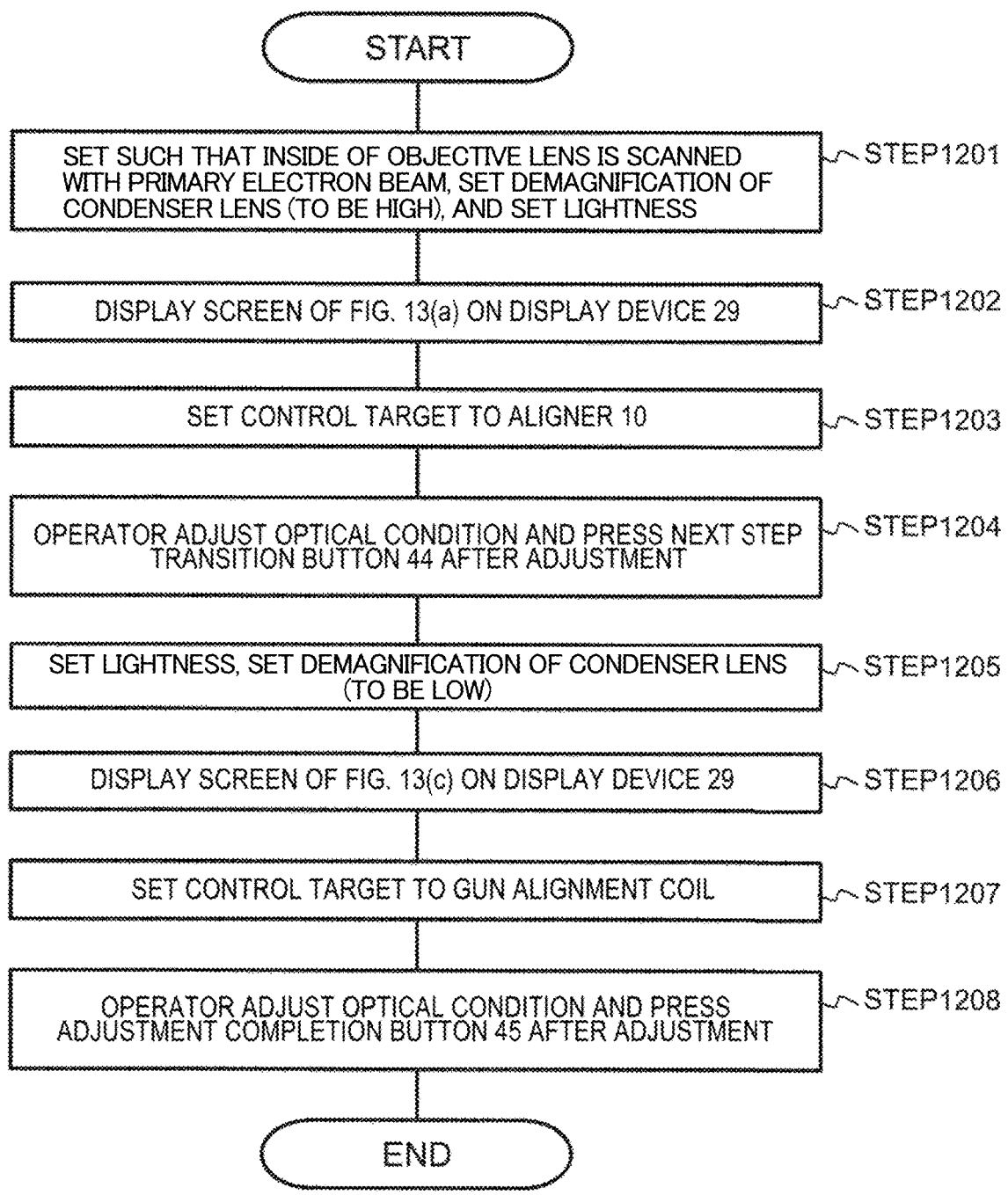
FIG. 12 is a flowchart of an adjustment sequence in Embodiment 3.

The process flow of FIG. 12 will be described below in detail.

STEP 1201: Before the adjustment, the operator observes the sample under the arbitrary condition. For this reason, a timing when the adjustment is performed according to this embodiment is desirably set to an optical condition proper for the adjustment.

In this embodiment, the adjusting method (described in FIG. 7) using the circular shape 37 is used. In order to obtain the circular shape 37, the computer 28 is set such that the inside of the objective lens 13 is scanned with the primary electron beam 4.

In the method described in FIG. 7, the adjustment starts from a state where the demagnification of the condenser lens is high. In this regard, the computer 28 outputs the instruction to the first condenser lens control circuit 21, the second condenser lens control circuit 22, or the like, and sets the demagnification of the condenser lens to be high.

The brightness of the circular shape 37 displayed at that time is changed by the condition before the adjustment. The computer 28 sets the brightness of the circular shape 37 to the brightness optimal for the adjustment through the signal control circuit 26.

In STEP 1201, various parameters such as the degree of vacuum in the device, the focusing position of the primary electron beam 4, and/or the position of the sample 14 may be set in addition to the above-described setting.

STEP 1202: The computer 28 displays the image of FIG. 13(a) on the display device 29. The center 38 of the circular shape 37 indicates the center (optical axis 32) of the objective lens. The center 39 of the entire image indicates the center (first center trajectory 33) of the primary electron beam 4. An X slider bar 41 and a Y slider bar 42 are provided in the screen.

When the operator operates the X slider bar 41 and/or the Y slider bar 42, the computer 28 outputs the instruction to the aligner control circuit 23, the gun alignment control circuit 20, or the like, and moves the central position of the primary electron beam 4. The moving amount at that time is determined according to the specified value of the X slider bar 41 and/or the Y slider bar 42.

Incidentally, a unit which moves the central position of the primary electron beam 4 is not limited to the slider bar. For example, a unit may be used which directly inputs an input value to the control circuit, the current value of the aligner 10 or like. A button or the like may be provided which increases and decreases the input value. As a hardware, a unit may be used which includes a controller such as a trackball or a cross key and moves the central position of the primary electron beam 4 according to the input of the controller. In addition, various other configurations may be used.

For the convenience of the operator, a reset button 43 may be provided on the screen. When the operator presses the reset button 43, the computer 28 controls the components to reset the movement of the primary electron beam 4 in response to the X slider bar 41 and the Y slider bar 42 (the slider bars return to the center).

STEP 1203: The computer 28 sets the control target responding to the X slider bar 41 and the Y slider bar 42 to (the aligner 10 through) the aligner control circuit 23. In STEP 1203, the operator can adjust the aligner 10 in a case where the demagnification is high.

STEP 1204: The operator matches the optical axis 32 with the first center trajectory 33 (matches the center 38 of the circular shape 37 with the center 39 of the entire image) by using the X slider bar 41 and/or the Y slider bar 42. FIG. 13(b) is a display on the display device 29 when the optical axis 32 matches the first center trajectory 33. After the centers match each other, the operator presses a next step transition button 44, and the procedure proceeds to a next step.

STEP 1205: The computer 28 outputs the instruction to the first condenser lens control circuit 21, the second condenser lens control circuit 22, and the like, and sets the demagnification of the condenser lens to be low. Since the brightness and the like are changed by the change of the demagnification, the computer 28 sets the brightness or other optical conditions together.

STEP 1206: The computer 28 displays the screen of FIG. 13(c) on the display device 29. The movement of the X slider bar 41, the Y slider bar 42, the reset button 43, and the like is similar to that described in STEP 1202.

STEP 1207: The computer 28 sets the control target responding to the X slider bar 41 and the Y slider bar 42 to (the upper gun alignment coil 5 or the lower gun alignment coil 6 through) the gun alignment control circuit 20. In STEP 1207, the operator can adjust the gun alignment coil in a case where the demagnification is low.

Incidentally, in a case where a plurality of gun alignment coils are included, the operator should adjust each of the gun alignment coils. In this regard, in a case where the plurality of gun alignment coils are included, the control ratio of the plurality of gun alignment coils is determined in advance, so as to reduce the parameters which the operator adjusts.

Figure 13:
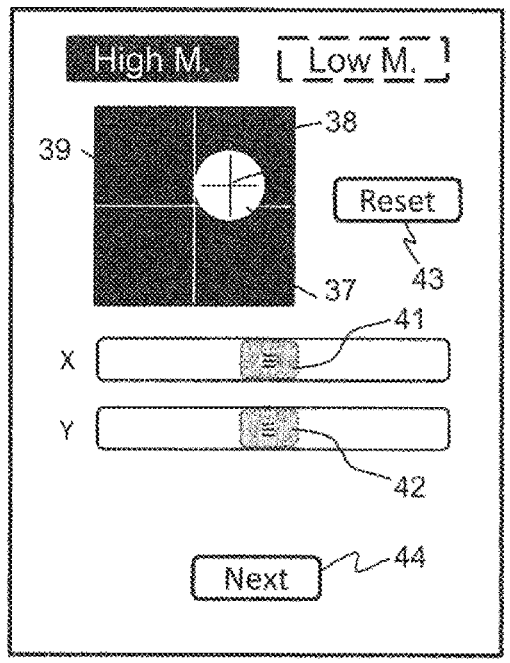
FIG. 13 is an image displayed on a display device 29 in Embodiment 3.
Figure 13:
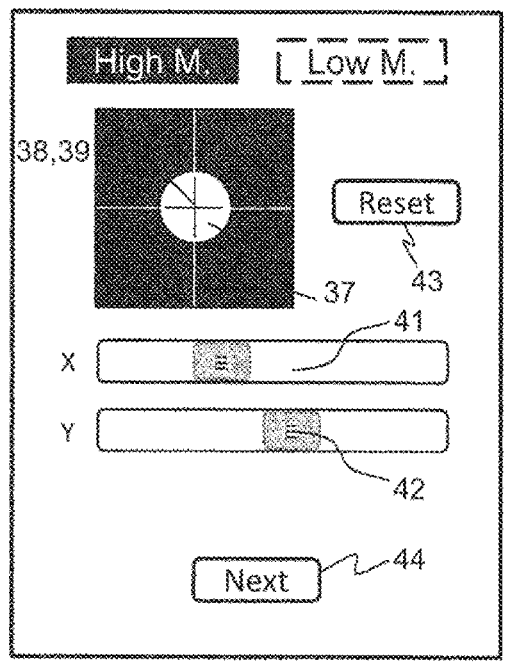
Figure 13:
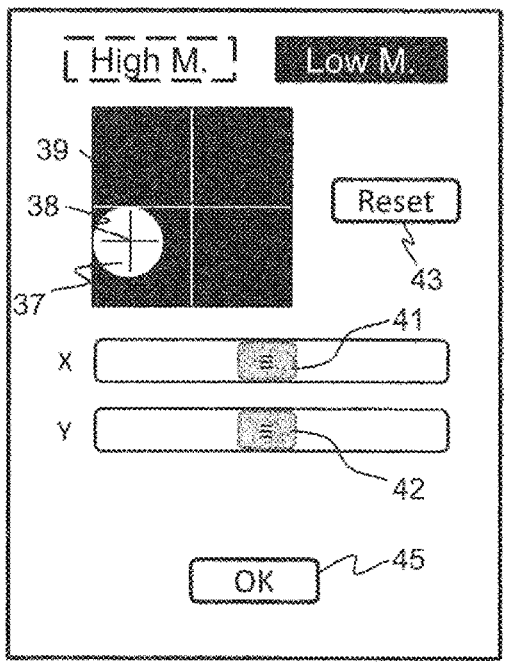
Figure 13:
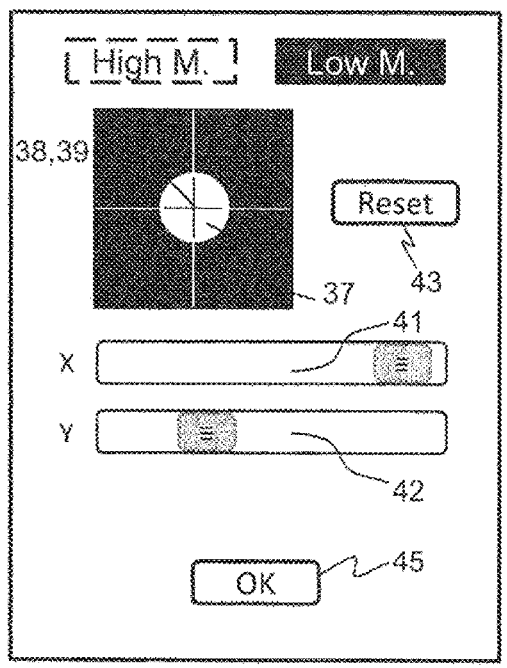

STEP 1208: The operator uses the X slider bar 41 and the Y slider bar 42 to match the optical axis 32 with the first center trajectory 33 (match the center 38 of the circular shape 37 with the center 39 of the entire image). FIG. 13(*d*) is a display on the display device 29 when the optical axis 32 matches the first center trajectory 33. After the centers match each other, the operator presses an adjustment completion button 45, and determines the optical conditions.

By adjusting the above-described steps, the operator can perform the adjustment easily according to a desirable sequence.

Incidentally, in STEP 1204, an operation may be performed such that the circular shape 37 is moved to the arbitrary position and the position (the circular shape when the demagnification is low) of the circular shape 37 in STEP 1208 is matched with the position (the position of the circular shape when the demagnification is high) of the circular shape 37 moved in STEP 1204. That "the circular shape is moved to the arbitrary position" includes a case where the circular shape is not moved at all.

Fourth Embodiment

In the fourth embodiment, a method is described which automatically performs the adjustment described in the above embodiment. Hereinafter, a difference from the above embodiments will be described mainly.

Figure 14:
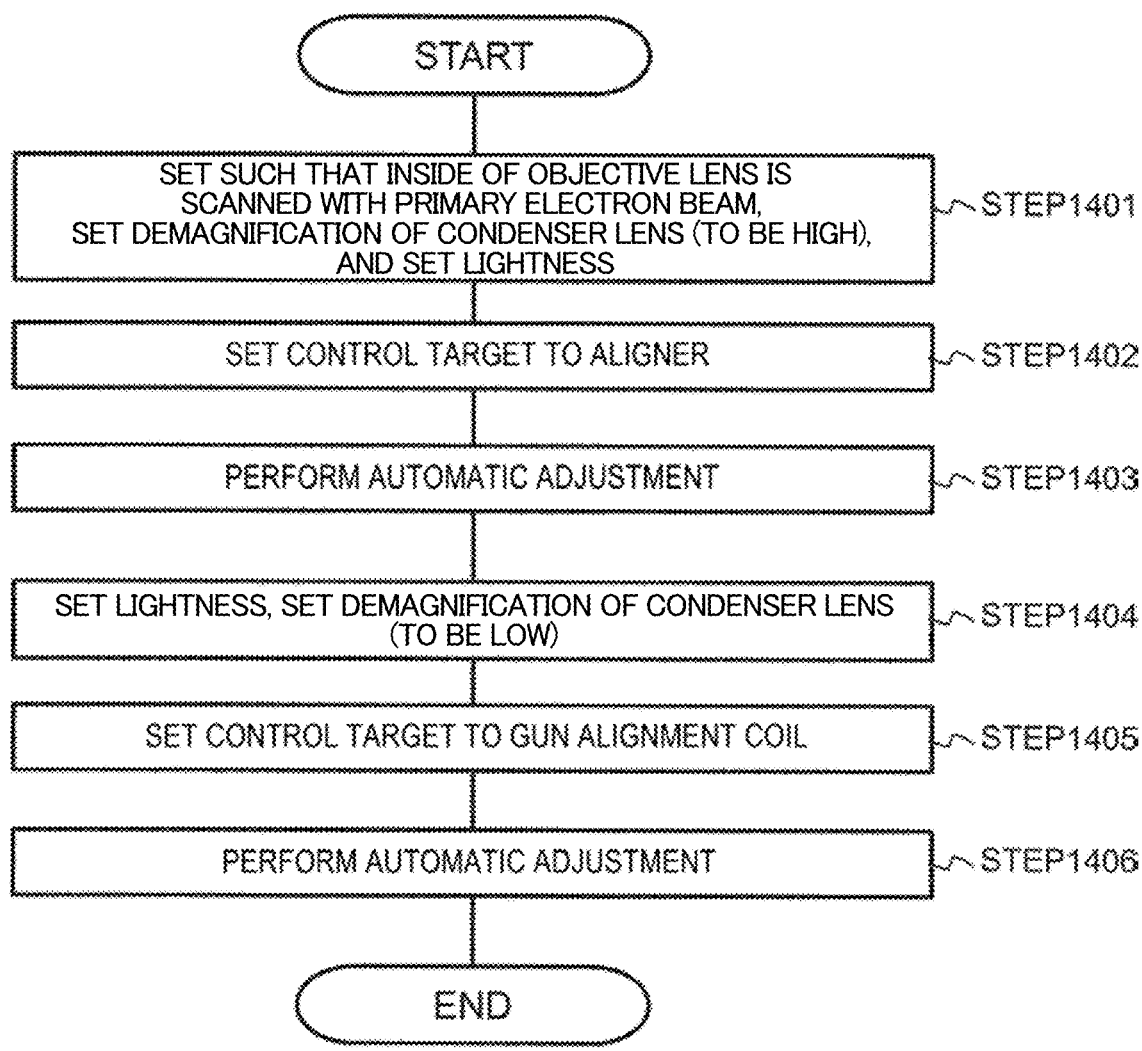
FIG. 14 is a flowchart of an adjustment sequence in a fourth embodiment.

FIG. 14 is a flowchart of the adjusting method of this embodiment. Hereinafter, the flow will be described in detail.

STEP 1401: The computer 28 performs the same process (to set a beam scanning condition, the demagnification, the brightness, and the like) as STEP 1201.

STEP 1402: In the adjusting method illustrated in Embodiment 3, STEP 1202 is required in which the operator performs the adjustment manually while viewing a screen display. In this embodiment, since the computer 28 performs the adjustment automatically, a step corresponding to STEP 1202 is not required necessarily. In this regard, the computer 28 sets the control target of the next step (STEP 1403) to (the aligner 10 through) the aligner control circuit 23.

STEP 1403: The computer 28 performs the automatic adjustment of the optical conditions which is a process corresponding to STEP 1204. In STEP 1402, the control target at the time of the automatic adjustment is set to the aligner control circuit 23.

The automatic adjustment can be implemented when the position of the center 38 of the circular shape 37 is measured through the image processing, and the input value input to the aligner control circuit 23 is determined by the position of the center 38 of the circular shape 37. The other known image processing methods may be used at the time of the automatic adjustment, and the method may be replaced, for example, with the process which obtains a centroid position of the circular shape 37. Incidentally, the expression of "image" processing is used for the convenience, but the target of the process is not necessarily imaged as long as the image is not necessarily displayed on the display device 29. The computer 28 may receive a signal value, which is not imaged, from the detector 17 to determine the input value input to the aligner control circuit 23 on the basis of the signal value.

STEP 1404: The computer 28 performs the same process (to set the beam scanning condition, the demagnification, the brightness, and the like) as STEP 1205.

STEP 1405: The computer 28 sets the control target of the next step (STEP 1406) to (the upper gun alignment coil 5 and the lower gun alignment coil 6 through) the gun alignment control circuit 20. As described in STEP 1402, a step corresponding to STEP 1206 is not required necessarily in this embodiment.

STEP 1406: The computer 28 performs the automatic adjustment of the optical conditions which is a process corresponding to STEP 1208. In STEP 1405, the control target at the time of the automatic adjustment is set to the gun alignment control circuit 20.

In Embodiment 3, the operator adjusts the optical conditions while viewing the image on the display device 29. In this embodiment, when the steps corresponding to STEP 1204 and STEP 1208 of Embodiment 3 are processed automatically, an adjusting effort of the operator can be saved, and the adjustment can be performed stably without depending on the skill of the operator so that even an operation beginner can perform the adjustment easily.

Incidentally, in STEP 1403, the computer 28 may record the position of the circular shape 37 in the storage unit 30, and may perform the process such that the position (in a case where the demagnification is low) of the center 38 of the circular shape 37 in STEP 1406 is matched with the position (in a case where the demagnification is high) recorded in STEP 1403.

Hereinbefore, the invention has been described according to the embodiments. However, the components may be replaced, added, or omitted, or the processing sequence may be exchanged without departing from the scope and spirit of the invention.

REFERENCE SIGNS LIST

1: filament
2: Wehnelt
3: anode
4: primary electron beam
5: upper gun alignment coil
6: lower gun alignment coil
7: first condenser lens
8: second condenser lens
9: objective aperture
10: aligner
11: upper deflection coil
12: lower deflection coil
13: objective lens
14: sample
15: stage
16: signal
17: detector
18: amplifier
19: high voltage control circuit
20: gun alignment control circuit
21: first condenser lens control circuit
22: second condenser lens control circuit
23: aligner control circuit 24: deflection control circuit
25: objective lens control circuit
26: signal control circuit
27: stage control circuit
28: computer
29: display device
30: storage unit
31: input unit
32: optical axis
33: first center trajectory
34: second center trajectory
35: main surface
36: virtual position
37: circular shape
38: center of circular shape 37
39: center of entire image
40: third center trajectory
41: X slider bar
42: Y slider bar
43: reset button
44: next step transition button
45: adjustment completion button

The invention claimed is:

1. A charged particle beam device comprising:
a charged particle source which emits a charged particle beam to be radiated on a sample;
a condenser lens system which has at least one condenser lens configured to focus the charged particle beam at a predetermined first demagnification and a predetermined second demagnification lower than the first magnification;
a deflector which is positioned between a condenser lens of a most downstream side in the condenser lens system and the charged particle source, and configured to move a virtual position of the charged particle source;
an objective aperture; and
a control unit configured to control the deflector and the condenser lens system,
wherein the control unit is configured to:
control the condenser lens system to change the focusing of the charged particle beam from the first demagnification to the second demagnification, and
control the deflector to move, when the condenser lens system changes to the second demagnification, the virtual position of the charged particle source to a position where a center trajectory of the charged particle beam between the condenser lens system and the objective aperture in a case where the condenser lens system has the second demagnification matches a center trajectory of the charged particle beam between the condenser lens system and the objective aperture in a case where the condenser lens system has the first demagnification.

2. The charged particle beam device according to claim 1, wherein:
the condenser lens system has two or more condenser lenses,
the condenser lens system is further configured to focus the charged particle beam at a predetermined third demagnification, and
the control unit is configured to:
move a focusing point of the charged particle beam between the condenser lens system and the objective aperture such that the center trajectory of the charged particle beam between the condenser lens system and the objective aperture in a case where the condenser lens system has the third demagnification substantially matches the center trajectory in a case where the condenser lens system has the first demagnification or the second demagnification.

3. The charged particle beam device according to claim 1, further comprising:
an objective lens which focuses the charged particle beam to the sample,
an optical system which is connected to the control unit and configured to adjust a condition of a radiation of the charged particle beam to the sample,
wherein the control unit is configured to control the optical system such that the center trajectory of the charged particle beam passes through a central axis in a main surface of the objective lens in the cases where the condenser lens system has the first demagnification and the second demagnification.

4. The charged particle beam device according to claim 3, further comprising:
a detector which detects a signal obtained by scanning the charged particle beam on the aperture, and
the control unit is configured to:
form an image, which indicates a positional relation between a central axis of the objective lens and the center trajectory of the charged particle beam on the basis of the signal of the detector,
display the image formed by the signal processing unit.

5. The charged particle beam device according to claim 4, wherein
the objective aperture is a fixed type.

6. The charged particle beam device according to claim 4, wherein the condition of the optical system is operatable independently in a case where the condenser lens system has the first demagnification and in a case where the condenser lens system has the second demagnification.

7. A charged particle beam device comprising:
a charged particle source which emits a charged particle beam radiated on the sample;
an optical system configured to adjust a condition of radiation of the charged particle beam on the sample and which includes:
a condenser lens system which has at least one condenser lens configured to focus the charged particle beam at a predetermined first demagnification and a predetermined second demagnification lower than the first magnification;
a deflector which is positioned between a condenser lens of a most downstream side in the condenser lens system and the charged particle source, and configured to move a virtual position of the charged particle source,
an objective aperture, and
an objective lens configured to focus the charged particle beam to the sample;
a detector which detects a signal obtained by colliding the charged particle beam with the sample;
a control unit configured to collect information of a positional relation between a central axis of the objective lens and a center trajectory of the charged particle beam between the condenser lens system and the objective aperture from the signal of the detector, and to control operating conditions of the optical system; and
a display device; and
wherein the control unit is configured to:
display information of the positional relation between the central axis of the objective lens and the center trajectory of the charged particle beam on the display device, display a user interface on the display device and to receive operator input via the user interface, and control the deflector to move the virtual position of the charged particle source to a position where a center trajectory of the charged particle beam between the condenser lens system and the objective aperture in a case where the condenser lens system has the second demagnification matches a center trajectory of the charged particle beam between the condenser lens system and the objective aperture in a case where the condenser lens system has the first demagnification.

8. The charged particle beam device according to claim 7, wherein the control unit is configured to control the operating conditions of the optical system such that the center trajectory passes through a central axis in a main surface of the objective lens in a case where the condenser lens system has the first demagnification.

9. The charged particle beam device according to claim 7, wherein:

the detector detects the signal by scanning the charged particle beam on the objective aperture, the control unit is configured to display an image, which indicates the positional relation between the central axis of the objective lens and the center trajectory of the charged particle beam based on the signal of the detector, on the display device.

10. An adjusting method of a charged particle beam device which reduces a charged particle beam emitted from a charged particle source by an optical system at a predetermined first demagnification and a predetermined second magnification lower than the first demagnification, and focuses the charged particle beam to a sample by an electrostatic or electromagnetic lens effect, the method comprising:

setting a center trajectory of the charged particle beam before and after the lens effect by adjusting a deflection angle of the charged particle beam by the optical system in a case where the charged particle beam is demagnified at the first demagnification; and adjusting a virtual position of the charged particle source by the electron optical system to match the center trajectory of the charged particle beam before and after the lens effect in a case where the charged particle beam is demagnified at the second demagnification with a center trajectory of the charged particle beam in the case where the charged particle beam is demagnified at the first demagnification.

11. The adjusting method of the charged particle beam device according to claim 10, wherein the deflection angle of the charged particle beam is adjusted to set the center trajectory to pass through a center of an electromagnetic field making the lens effect.

12. The adjusting method of the charged particle beam device according to claim 11, further comprising:

collecting information of a positional relation between the center of the electromagnetic field making the lens effect and the center trajectory of the charged particle beam after the lens effect from a signal obtained by colliding the charged particle beam with the sample; and calculating an adjusting amount of the deflection angle of the charged particle source from the information of the positional relation to set the center trajectory to pass through the center of the electromagnetic field making the lens effect.

13. The adjusting method of the charged particle beam device according to claim 10, further comprising:

collecting information of a positional relation between the center of an electromagnetic field making the lens effect and the center trajectory of the charged particle beam after the lens effect from a signal obtained by colliding the charged particle beam with the sample; and calculating an adjusting amount of the virtual position of the charged particle source from the information of the positional relation to match the center trajectory of the charged particle beam at the second demagnification with the center trajectory of the charged particle beam at the first demagnification.

14. The adjusting method of the charged particle beam device according to claim 10, further comprising:

collecting the information of a positional relation between a center of an electromagnetic field making the lens effect and the center trajectory of the charged particle beam after the lens effect from a signal obtained by colliding the charged particle beam with the sample;

in a process of setting the center trajectory of the charged particle beam, displaying a user interface on a screen which includes the positional relation between the center of the electromagnetic field and the center trajectory of the charged particle beam at the first demagnification; and in a process matching the center trajectory at the second demagnification with the center trajectory at the first demagnification, displaying a user interface on the screen which includes the positional relation between the center of the electromagnetic field and the center trajectory of the charged particle beam at the second demagnification.

* * * * *